United States Patent
Kimura et al.

(10) Patent No.: US 8,609,319 B2
(45) Date of Patent: Dec. 17, 2013

(54) RADIATION-SENSITIVE RESIN COMPOSITION AND RESIST FILM FORMED USING THE SAME

(75) Inventors: Toru Kimura, Tokyo (JP); Hiromitsu Nakashima, Tokyo (JP); Reiko Kimura, Tokyo (JP); Kazuki Kasahara, Tokyo (JP); Masafumi Hori, Tokyo (JP); Masafumi Yoshida, Tokyo (JP)

(73) Assignee: JSR Corporation, Tokyo (JP)

( * ) Notice: Subject to any disclaimer, the term of this patent is extended or adjusted under 35 U.S.C. 154(b) by 88 days.

(21) Appl. No.: 13/243,060

(22) Filed: Sep. 23, 2011

(65) Prior Publication Data

US 2012/0082935 A1 Apr. 5, 2012

(30) Foreign Application Priority Data

Oct. 1, 2010 (JP) ................. 2010-223972

(51) Int. Cl.
*G03F 7/00* (2006.01)
*G03F 7/004* (2006.01)

(52) U.S. Cl.
USPC ................. 430/270.1; 430/905

(58) Field of Classification Search
USPC ................. 430/270.1
See application file for complete search history.

(56) References Cited

U.S. PATENT DOCUMENTS

| | | | | |
|---|---|---|---|---|
| 8,012,669 | B2 * | 9/2011 | Shimizu et al. | 430/270.1 |
| 8,057,928 | B2 * | 11/2011 | Kohn et al. | 429/7 |
| 8,129,086 | B2 * | 3/2012 | Hatakeyama et al. | 430/270.1 |
| 8,263,307 | B2 * | 9/2012 | Irie et al. | 430/270.1 |
| 2011/0318690 | A1 * | 12/2011 | Yamashita et al. | 430/285.1 |

FOREIGN PATENT DOCUMENTS

| | | |
|---|---|---|
| JP | 05-188598 | 7/1993 |
| JP | 06-012452 | 2/1994 |
| JP | 09-073173 | 3/1997 |
| JP | 2006-309245 | 11/2006 |
| JP | 2007-204385 | 8/2007 |
| JP | 2007-304537 | 11/2007 |
| JP | 2008-088343 | 4/2008 |
| JP | 2008-111103 | 5/2008 |
| JP | 2009-019199 | 1/2009 |
| JP | 2009-074085 | 4/2009 |
| JP | 2009-134088 | 6/2009 |
| JP | 2010-002870 | 1/2010 |
| JP | 2010-032994 | 2/2010 |
| JP | 2010-066503 | 3/2010 |
| JP | 2010-122579 | 6/2010 |
| WO | WO 2006/035790 | 4/2006 |
| WO | WO 2007/116664 | 10/2007 |
| WO | WO 2009/041270 | 4/2009 |
| WO | WO 2009/051088 | 4/2009 |

OTHER PUBLICATIONS

Machine translation of JP 2010-122579 (no date).*
Nishikubo et al., "Convenient Syntheses of Cyclic Carbonates by New Reaction of Oxiranes with β-Butyrolactone", Tetrahedron Letters, 1986, pp. 3741-3744, vol. 27, No. 32.
Vincenzo Caló et al., "Cyclic Carbonate Formation from Carbon Dioxide and Oxiranes in Tetrabutylammonium Halides as Solvents and Catalysts", Organic Letters, 2002, pp. 2561-2563, vol. 4, No. 15.

* cited by examiner

*Primary Examiner* — Amanda C. Walke
(74) *Attorney, Agent, or Firm* — Ditthavong Mori & Steiner, P.C.

(57) ABSTRACT

A radiation-sensitive resin composition that includes (A) a polymer that includes a repeating unit (a1) and a fluorine atom, the repeating unit (a1) including a group shown by the following formula (1) or (2), the radiation-sensitive resin composition including the polymer (A) in an amount of 0.1 mass % or more and less than 20 mass % based on the total amount of polymers included in the radiation-sensitive resin composition.

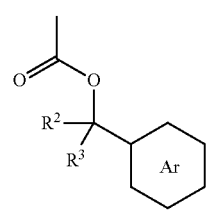

(1)

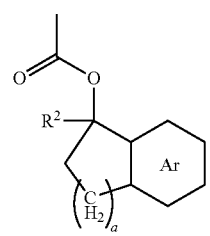

(2)

17 Claims, No Drawings

RADIATION-SENSITIVE RESIN COMPOSITION AND RESIST FILM FORMED USING THE SAME

CROSS-REFERENCE TO RELATED APPLICATIONS

The present application claims priority under 35 U.S.C. §119 to Japanese Patent Application No. 2010-223972, filed Oct. 1, 2010. The contents of this application are incorporated herein by reference in their entirety.

TECHNICAL FIELD

The invention relates to a radiation-sensitive resin composition and a resist film formed using the same.

BACKGROUND ART

In the field of microfabrication such as production of integrated circuit devices, a fine resist pattern may be formed by forming a resist film on a substrate using a resin composition, exposing the resist film via a mask pattern, and removing the exposed area or the unexposed area using an alkaline developer. A chemically-amplified resist is generally utilized as the resist. The chemically-amplified resist includes a polymer (base resin) that includes a functional group (acid-labile group) that dissociates (is deprotected) due to an acid. The acid-labile group dissociates due to an acid generated upon exposure, so that the base resin changes in solubility in a developer. A pattern is formed by utilizing the above phenomenon.

Various chemically-amplified resist resin compositions have been proposed (see Japanese Patent Application Publication (KOKAI) No. 9-73173 and Japanese Patent Application Publication (KOKAI) No. 2010-122579, for example). Japanese Patent Application Publication (KOKAI) No. 9-73173 discloses a resin composition that includes a polymer (base resin) that includes an alicyclic hydrocarbon group as the acid-labile group, and Japanese Patent Application Publication (KOKAI) No. 2010-122579 discloses a resin composition that includes a polymer (base resin) that includes an aromatic ring-containing group as the acid-labile group.

In recent years, liquid immersion lithography that exposes a resist film in a state in which an immersion liquid (e.g., purified water or fluorine-containing inert liquid) is provided between the lens and the resist film has become widespread as a method that can form a fine resist pattern having a line width of about 60 nm or less. The numerical aperture (NA) of the lens can be increased when using liquid immersion lithography. Moreover, the depth of focus decreases to only a small extent, and high resolution can be obtained even when increasing the NA of the lens.

It is preferable that the resist film used for liquid immersion lithography exhibit high surface hydrophobicity during liquid immersion lithography from the viewpoint of improving the scan speed resistance while suppressing elution of the resist film composition into the immersion liquid, occurrence of defects due to droplets that remain on the surface of the film, and the like. On the other hand, it is necessary to improve the solubility of the exposed area (when using a positive-tone resist) in a developer during development.

In view of the above situation, various resin compositions used for liquid immersion lithography have been proposed (see Japanese Patent Application Publication (KOKAI) No. 2006-309245, WO2007/116664, and Japanese Patent Application Publication (KOKAI) No. 2010-2870). Japanese Patent Application Publication (KOKAI) No. 2006-309245, WO2007/116664, and Japanese Patent Application Publication (KOKAI) No. 2010-2870 disclose a resin composition that includes a fluorine-containing polymer that includes a group that exhibits high water repellency and includes a fluorine atom, and an acid-labile group that includes an alicyclic or chain-like hydrocarbon group. Specifically, the fluorine-containing polymer is localized in the surface layer of the resist film, so that the surface of the resist film exhibits hydrophobicity due to the fluorine atom. The fluorine-containing polymer disclosed in Patent Document 5 is designed so that the group that exhibits high water repellency dissociates via a reaction with a developer to produce a polar group, and the acid-labile group dissociates upon exposure to produce a polar group, so that the fluorine-containing polymer present in the exposed area exhibits improved solubility in a developer.

According to the invention, a radiation-sensitive resin composition includes (A) a polymer that includes a repeating unit (a1) and a fluorine atom, the repeating unit (a1) including a group shown by a formula (1) or (2), the radiation-sensitive resin composition including the polymer (A) in an amount of 0.1 mass % or more and less than 20 mass % based on a total amount of polymers included in the radiation-sensitive resin composition,

[Chemical Formula 1]

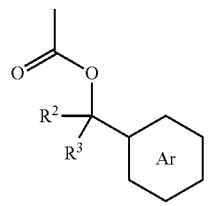

(1)

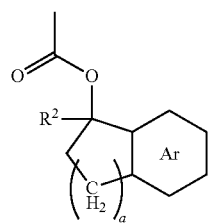

(2)

wherein the following formula represents a substituted or unsubstituted aromatic hydrocarbon group,

[Chemical Formula 2]

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with a carbon atom bonded to $R^2$ and $R^3$, and a is 1 or 2.

The surface of the resist film formed using the radiation-sensitive resin composition that includes the polymer (A) exhibits hydrophobicity during liquid immersion lithography, and the exposed area rarely remains undeveloped during development after liquid immersion lithography. As a result, defects such as bridge defects can be advantageously suppressed.

According to the invention, a resist film is formed using the radiation-sensitive resin composition. Since the resist film is formed using the radiation-sensitive resin composition described above, occurrence of defects can be suppressed as much as possible when forming a resist pattern using the resist film. Moreover, the resist film exhibits excellent lithographic performance.

The term "chain-like hydrocarbon group" used herein refers to a hydrocarbon group that does not include a cyclic structure in the main chain, and includes only a chain-like structure. The term "chain-like hydrocarbon group" used herein includes a linear hydrocarbon group and a branched hydrocarbon group. The term "alicyclic hydrocarbon group" used herein refers to a hydrocarbon group that includes only an alicyclic hydrocarbon structure as a cyclic structure, and does not include an aromatic ring structure. Note that the alicyclic hydrocarbon group need not necessarily include only an alicyclic hydrocarbon structure, but may also include a chain-like structure. The term "aromatic hydrocarbon group" used herein refers to a hydrocarbon group that includes an aromatic ring structure. Note that the aromatic hydrocarbon group need not necessarily be formed only of an aromatic ring structure, but may also include a chain structure or an alicyclic hydrocarbon structure.

The term "(meth)acryl" used herein refers to "acryl" or "methacryl".

DESCRIPTION OF THE EMBODIMENTS

According to the invention, a radiation-sensitive resin composition includes (A) a polymer that includes a repeating unit (a1) and a fluorine atom, the repeating unit (a1) including a group shown by a formula (1) or (2), the radiation-sensitive resin composition including the polymer (A) in an amount of 0.1 mass % or more and less than 20 mass % based on a total amount of polymers included in the radiation-sensitive resin composition.

[Chemical Formula 1]

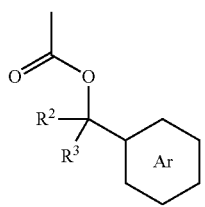

(1)

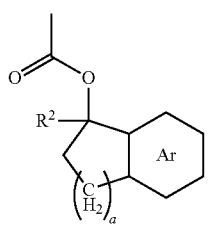

(2)

wherein the following formula represents a substituted or unsubstituted aromatic hydrocarbon group.

[Chemical Formula 2]

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with a carbon atom bonded to $R^2$ and $R^3$, and a is 1 or 2.

Since the polymer (A) includes a fluorine atom, the polymer (A) tends to be localized (unevenly distributed) in the surface layer of the resist film formed using the radiation-sensitive resin composition that includes the polymer (A) as a polymer component. This ensures that the surface of the resist film exhibits hydrophobicity during liquid immersion lithography. The group shown by the formula (1) or (2) included in the polymer (A) has a structure in which the linkage between the carbon atom bonded to $R^2$ and the oxygen atom bonded to the carbon atom breaks due to an acid so that a carbocation is eliminated to produce a carboxylic acid unit. Since the carbocation eliminated due to the deprotection reaction is resonance-stabilized, high reactivity is obtained as compared with a group that does not include an aromatic ring. Specifically, the polymer (A) that includes the group shown by the formula (1) or (2) easily produces a carboxylic acid unit due to an acid, and exhibits excellent solubility in a developer after exposure. Therefore, the surface of the resist film formed using the radiation-sensitive resin composition that includes the polymer (A) exhibits hydrophobicity during liquid immersion lithography, and the exposed area rarely remains undeveloped during development after liquid immersion lithography. As a result, defects such as bridge defects can be advantageously suppressed.

The resist film formed using the radiation-sensitive resin composition shows a large difference in dissolution rate between the exposed area and the unexposed area, so that the resolution can be improved. Moreover, the resulting resist pattern exhibits excellent linearity, and has a rectangular shape (i.e., an excellent pattern shape is obtained), a change in dimensions of the pattern due to a change in dose occurs to only a small extent, and excellent dimensional accuracy with respect to a mask is achieved. The above effects and advantages (i.e., suppression of defects, an increase in resolution, and an improvement in pattern shape) may be achieved when the radiation-sensitive resin composition includes the polymer (A) in an amount of 0.1 mass % or more and less than 20 mass % based on the total amount of polymers included in the radiation-sensitive resin composition.

In the radiation-sensitive resin composition according to the invention, the repeating unit (a1) may be a repeating unit shown by a formula (3) or (4). In this case, the resolution can be further improved.

[Chemical Formula 3]

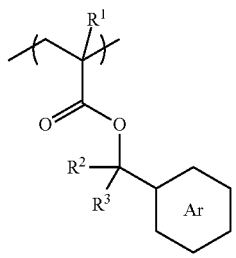

(3)

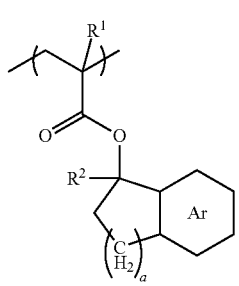

(4)

wherein the following formula represents a substituted or unsubstituted aromatic hydrocarbon group,

[Chemical Formula 4]

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with a carbon atom bonded to $R^2$ and $R^3$, a is 1 or 2, $R^1$ represents a hydrogen atom, a fluorine atom, or a monovalent chain-like hydrocarbon group that may be substituted with a fluorine atom.

In the radiation-sensitive resin composition according to the invention, the polymer (A) may include a repeating unit (f) that includes a fluorine atom (excluding a repeating unit that falls under the repeating unit (a1)). The polymer (A) may include a repeating unit that reacts with a developer to produce a polar group as the repeating unit (f), and the polar group may be a carboxyl group. In this case, since the polymer (A) produces a carboxylic acid unit due to a reaction with an alkaline developer, the solubility of the polymer (A) in the developer can be further improved.

According to the invention, a resist film is formed using the radiation-sensitive resin composition. Since the resist film is formed using the radiation-sensitive resin composition described above, occurrence of defects can be suppressed as much as possible when forming a resist pattern using the resist film. Moreover, the resist film exhibits excellent lithographic performance.

The term "hydrocarbon group" used herein includes a chain-like hydrocarbon group, an alicyclic hydrocarbon group, and an aromatic hydrocarbon group. The hydrocarbon group may be a saturated hydrocarbon group or an unsaturated hydrocarbon group.

The term "chain-like hydrocarbon group" used herein refers to a hydrocarbon group that does not include a cyclic structure in the main chain, and includes only a chain-like structure. The term "chain-like hydrocarbon group" used herein includes a linear hydrocarbon group and a branched hydrocarbon group. The term "alicyclic hydrocarbon group" used herein refers to a hydrocarbon group that includes only an alicyclic hydrocarbon structure as a cyclic structure, and does not include an aromatic ring structure. Note that the alicyclic hydrocarbon group need not necessarily include only an alicyclic hydrocarbon structure, but may also include a chain-like structure. The term "aromatic hydrocarbon group" used herein refers to a hydrocarbon group that includes an aromatic ring structure. Note that the aromatic hydrocarbon group need not necessarily be formed only of an aromatic ring structure, but may also include a chain structure or an alicyclic hydrocarbon structure.

The term "(meth)acryl" used herein refers to "acryl" or "methacryl".

A radiation-sensitive resin composition according to the invention includes (A) a polymer that includes a fluorine atom as a polymer component. The radiation-sensitive resin composition includes (B) a polymer that changes in solubility in a developer due to an acid as another polymer component. The radiation-sensitive resin composition may include (C) an acid generator as a preferable optional component, and may also include (D) an acid diffusion controller, (E) a solvent, (F) an additive, or the like as an additional optional component. Each component is described below.

<Polymer (A)>

The polymer (A) includes a repeating unit (a1) that includes a group shown by the following formula (1) or (2).

[Chemical Formula 5]

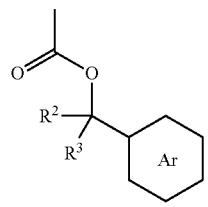

(1)

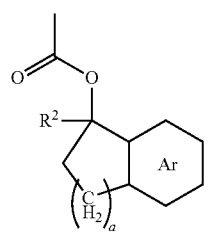

(2)

wherein the following formula represents a substituted or unsubstituted aromatic hydrocarbon group,

[Chemical Formula 6]

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with the carbon atom bonded to $R^2$ and $R^3$, and a is 1 or 2.

The number of carbon atoms of the ring skeleton of the aromatic hydrocarbon group (see the following formula) in the formulas (1) and (2) is preferably 6 to 15. Specific examples of such a ring skeleton include a benzene ring, a naphthalene ring, a phenanthrene ring, an anthracene ring, a fluorene ring, and the like.

[Chemical Formula 7]

A carbocation eliminated from the group shown by the formula (1) or (2) is stabilized due to the aromatic ring, so that the reactivity during the elimination reaction can be improved. In the polymer (A), a carboxylic acid unit is formed due to elimination of the carbocation. Therefore, the polymer (A) exhibits high affinity to a developer in the exposed area, and a situation in which the exposed area remains undeveloped rarely occurs. Moreover, the dry etching resistance of the polymer (A) can be improved due to the aromatic ring.

The aromatic hydrocarbon group may include only an aromatic ring structure, or may have a structure in which the aromatic ring structure includes (is substituted with) a linear or branched alkyl group or an alicyclic hydrocarbon group. The number of carbon atoms of the alkyl group or the alicyclic hydrocarbon group that may substitute the aromatic ring structure is preferably 1 to 10, and more preferably 1 to 3. Specific examples of the aromatic hydrocarbon group include groups obtained by removing one hydrogen atom (formula (1)) or two hydrogen atoms (formula (2)) from the aromatic rings shown by the following formulas (h1) to (h5).

[Chemical Formula 8]

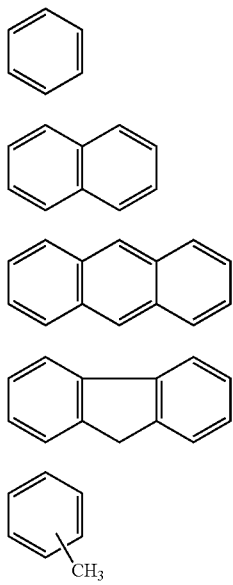

(h1)

(h2)

(h3)

(h4)

(h5)

Note that the aromatic hydrocarbon group may be substituted with a halogen atom (fluorine atom, chlorine atom, bromine atom, or iodine atom), a hydroxyl group, a carboxyl group, a nitro group, a cyano group, or the like.

Specific examples of the linear alkyl group represented by $R^2$ and $R^3$ include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, and the like. The number of carbon atoms of the linear alkyl group is preferably 1 to 6, and more preferably 1 or 2.

Examples of the branched alkyl group represented by $R^2$ and $R^3$ include branched alkyl groups having 3 to 12 carbon atoms. Specific examples of the branched alkyl groups having 3 to 12 carbon atoms include an isopropyl group, an isobutyl group, a sec-butyl group, a tert-butyl group, an isopentyl group, a neopentyl group, an isohexyl group, a 3-methylpentyl group, a 2,2-dimethylbutyl group, a 2,3-dimethylbutyl group, and the like.

The number of carbon atoms of the alicyclic hydrocarbon group represented by $R^2$ and $R^3$ is 3 to 12. Examples of the alicyclic hydrocarbon group include a group obtained by removing one hydrogen atom from a monocycloalkane or a polycycloalkane (e.g., bicycloalkane or tricycloalkane). Specific examples of such a group include monocycloalkyl groups such as a cyclopentyl group and a cyclohexyl group, bicycloalkyl groups such as a norbornyl group and an isobornyl group, tricycloalkyl groups such as an adamantyl group and a tricyclodecanyl group, and the like.

Examples of the ring (i.e., divalent alicyclic hydrocarbon group) formed by $R^2$ and $R^3$ include cyclopentane, cyclohexane, cycloheptane, cyclooctane, norbornane, adamantane, and the like. A monovalent chain-like hydrocarbon group such as a methyl group may be bonded to these rings. Cyclopentane, methylcyclopentane, cyclooctane, or adamantane is preferable as the ring formed by $R^2$ and $R^3$.

The number of carbon atoms of the aromatic hydrocarbon group represented by $R^2$ is preferably 6 to 12. Examples of the aromatic hydrocarbon group represented by $R^2$ include aryl groups such as a phenyl group, a tolyl group, a xylyl group, and a mesityl group.

Examples of the repeating unit (a1) that includes the group shown by the formula (1) or (2) include repeating units derived from a (meth)acrylate derivative, a (meth)acrylamide derivative, a vinyl ether derivative, an olefin derivative, a styrene derivative, and the like that include the structure shown by the formula (1) or (2). Among these, a repeating unit derived from a (meth)acrylate derivative is preferable. Specifically, it is preferable that the polymer (A) include a repeating unit shown by the following formula (3) or (4) as the repeating unit (a1).

[Chemical Formula 9]

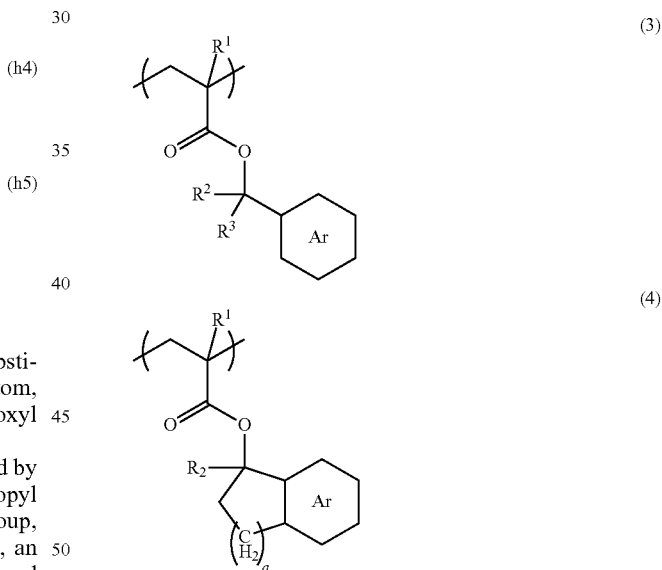

wherein the following formula, $R^2$, $R^3$, and a are the same as defined for the formulas (1) and (2), and

[Chemical Formula 10]

$R^1$ represents a hydrogen atom, a fluorine atom, or a monovalent chain-like hydrocarbon group that may be substituted with a fluorine atom.

Examples of the monovalent chain-like hydrocarbon group represented by $R^1$ include a group obtained by substituting 1 to 10 hydrogen atoms of a chain-like hydrocarbon group having 1 to 5 carbon atoms with a fluorine atom. $R^1$ preferably represents a hydrogen atom, a fluorine atom, a methyl group, or a trifluoromethyl group.
Specific examples of the group shown by the formula (1) or (2) include groups (repeating units) shown by the following formulas.
[Chemical Formula 11]
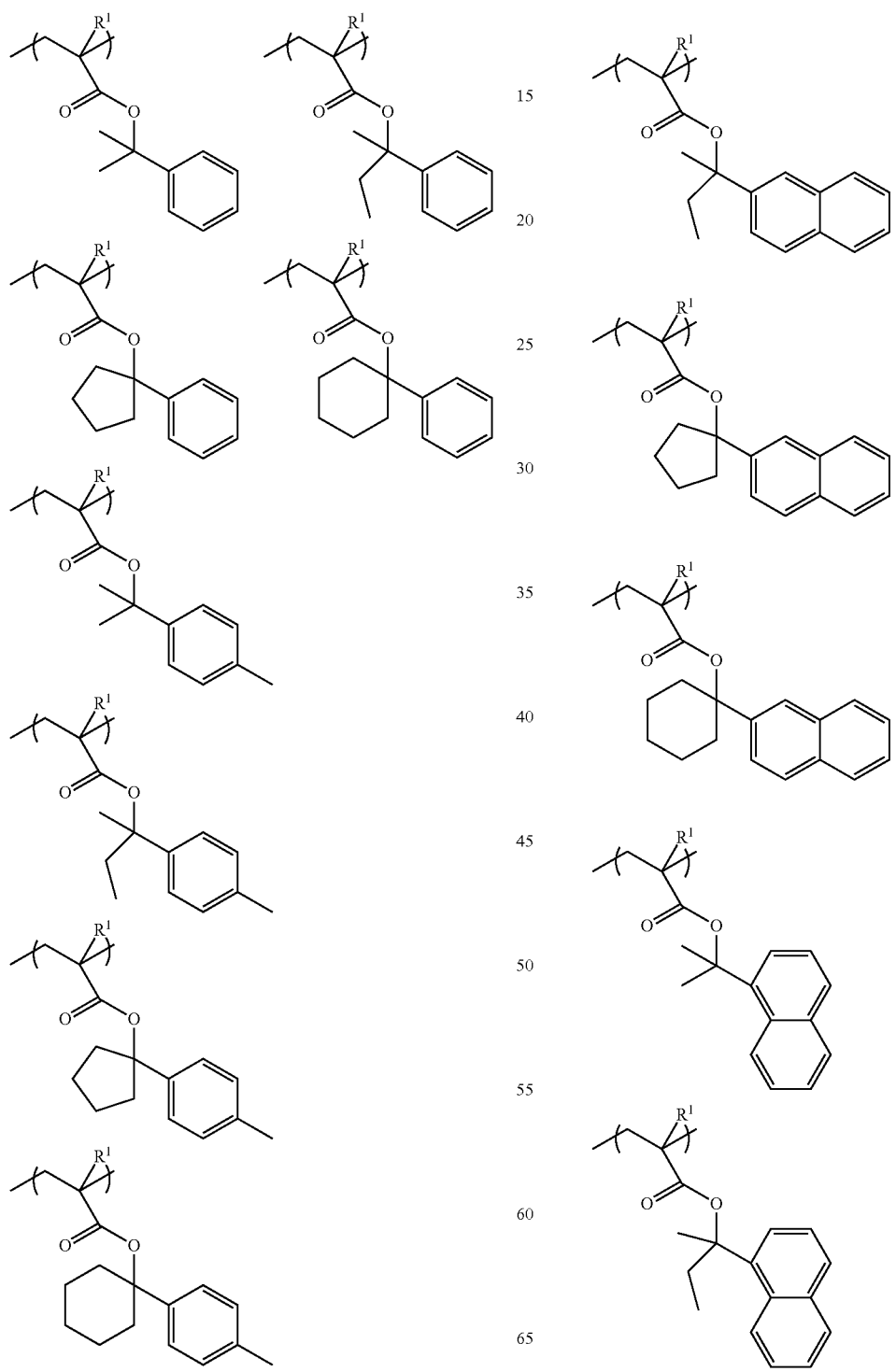

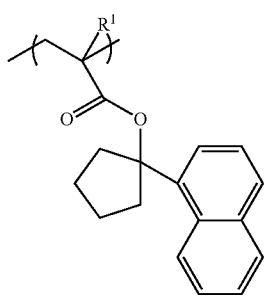
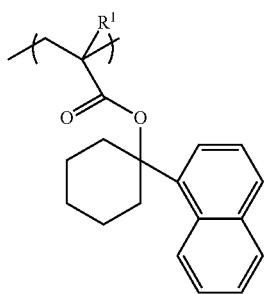
[Chemical Formula 12]
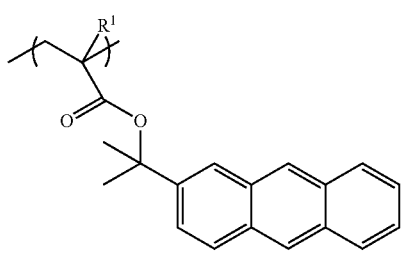
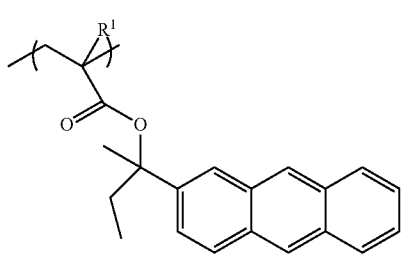
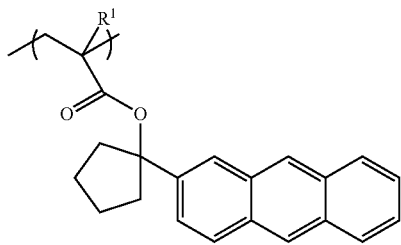
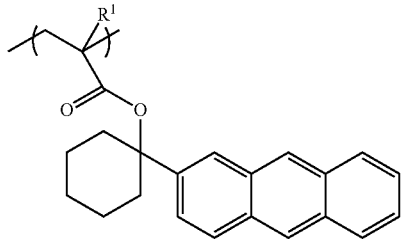
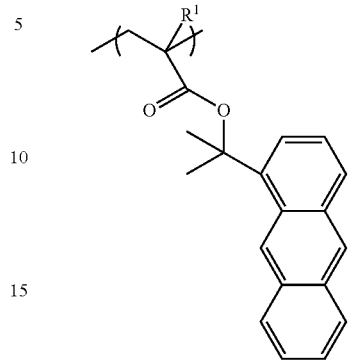
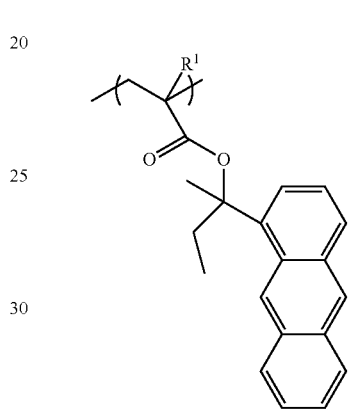
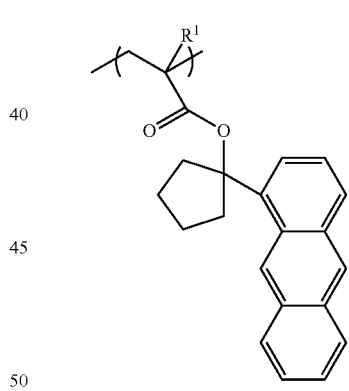
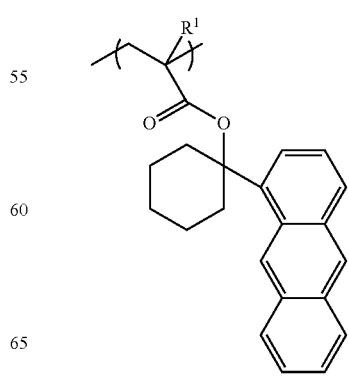

13
-continued
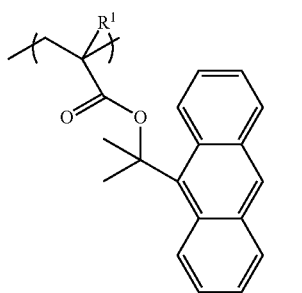
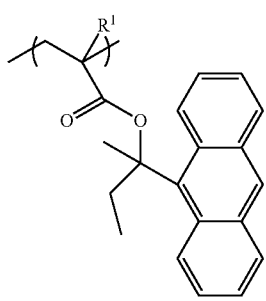
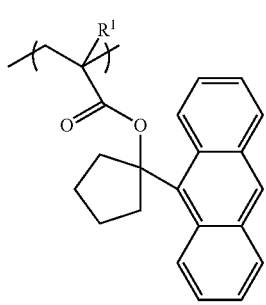
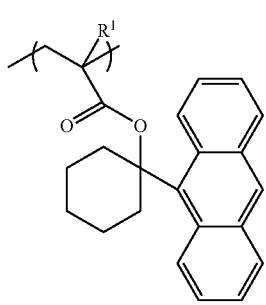
[Chemical Formula 13]
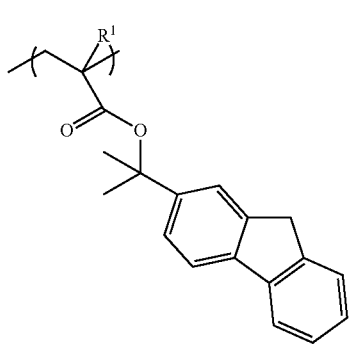
14
-continued
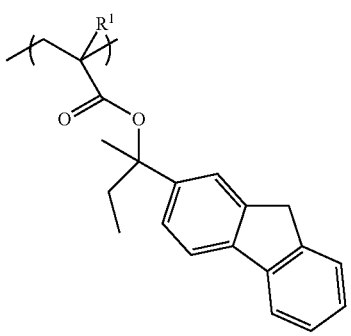
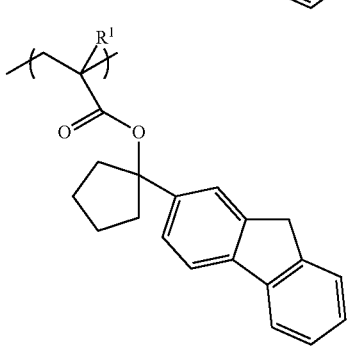
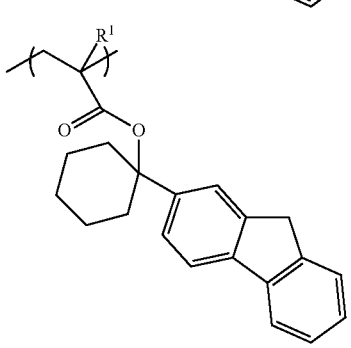
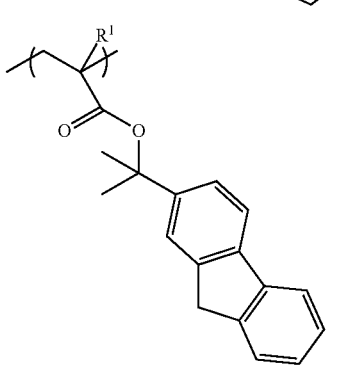
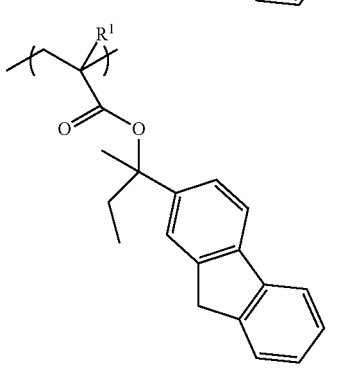

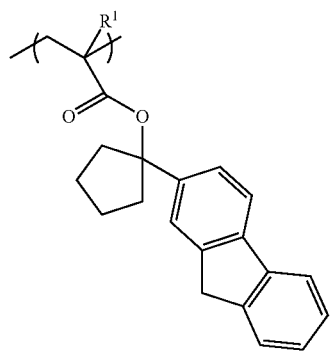
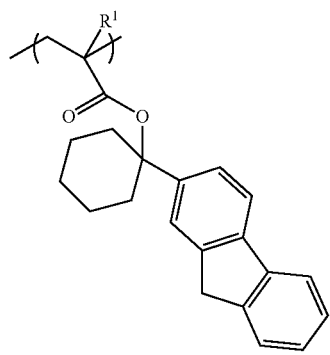
[Chemical Formual 14]
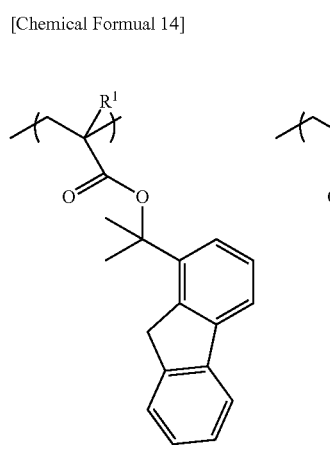
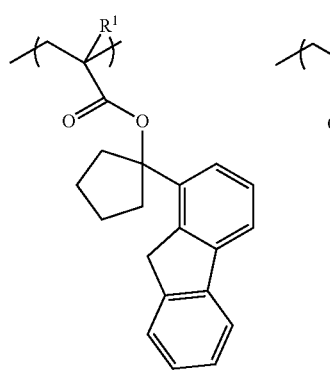
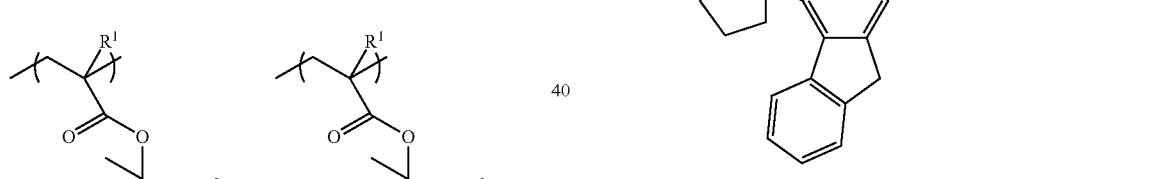
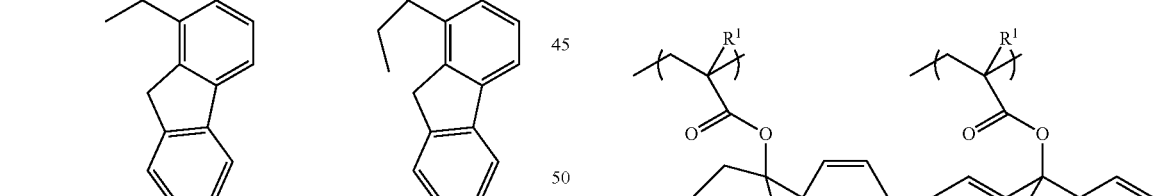
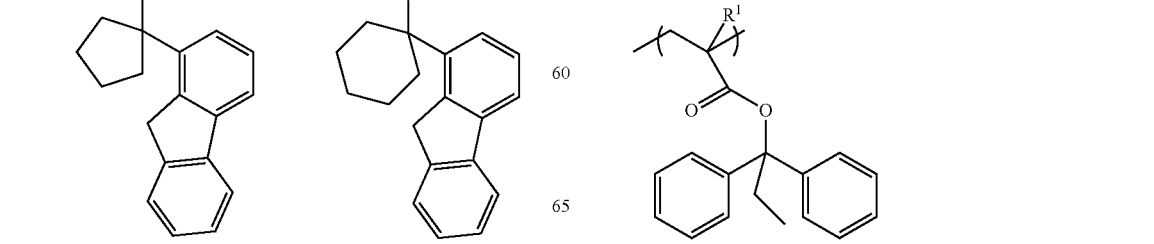

[Chemical Formula 15]

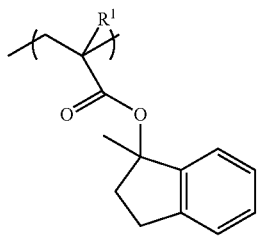

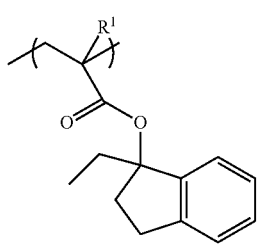

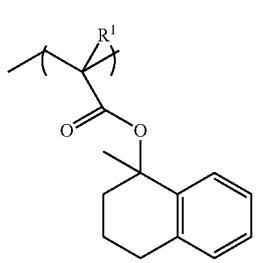

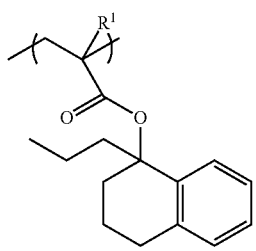

The content of the repeating unit (a1) in the polymer (A) is preferably 95 mol % or less, and more preferably 5 to 95 mol %, based on the total repeating units included in the polymer (A). If the content of the repeating unit (a1) is within the above range, a sufficient number (amount) of carboxylic acid units are formed in the polymer (A) in the exposed area, so that the polymer (A) in the exposed area can be sufficiently dissolved in a developer. Note that the polymer (A) may include only one type of repeating unit (a1), or may include two or more types of repeating unit (a1).

The polymer (A) is produced by subjecting a monomer that produces the repeating unit (a1) to radical polymerization optionally together with a monomer that produces an additional repeating unit. Examples of a monomer that produces the repeating unit (a1) that includes the group shown by the formula (1) include a monomer shown by the following formula (1-1). Examples of a monomer that produces the repeating unit (a1) that includes the group shown by the formula (2) include a monomer shown by the following formula (2-1).

[Chemical Formula 16]

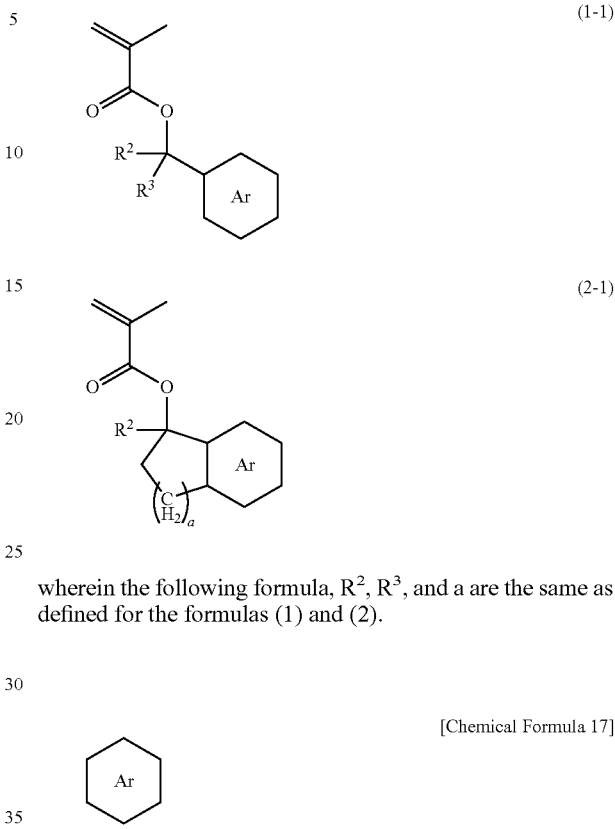

wherein the following formula, $R^2$, $R^3$, and a are the same as defined for the formulas (1) and (2).

[Chemical Formula 17]

<Fluorine Atom>

The polymer (A) includes a fluorine atom. This ensures that the polymer (A) is unevenly distributed in the surface layer of the resist film, and the surface of the resist film exhibits high hydrophobicity during liquid immersion lithography. Therefore, it is unnecessary to provide a liquid immersion lithography protective film on the resist film formed using the radiation-sensitive resin composition. When forming a resist pattern using such a resist film that does not require an upper-layer film, the throughput is improved since it is unnecessary to form a protective film (upper-layer film).

The polymer (A) may include a fluorine atom bonded to $R^1$ or the aromatic hydrocarbon group included in the repeating unit (a1), but preferably includes a repeating unit (f) that includes a fluorine atom in addition to the repeating unit (a1).

<Repeating Unit (f)>

The repeating unit (f) is not particularly limited as long as the repeating unit (f) includes a fluorine atom. It is preferable that the repeating unit (f) exhibit high affinity to a developer. In this case, the polymer (A) in the exposed area exhibits further improved solubility in a developer, so that a situation in which the polymer (A) in the exposed area remains undissolved can be suppressed.

Examples of a preferable repeating unit (f) include the following repeating units (f1) to (f5). The repeating units (f1) to (f5) are described below.

<Repeating unit (f1)>

A structural unit shown by the following formula (f-1) is preferable as the repeating unit (f).

[Chemical Formula 18]

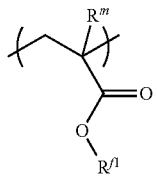
(f-1)

wherein $R^m$ represents a hydrogen atom, a fluorine atom, or a monovalent chain-like hydrocarbon group that may be substituted with a fluorine atom, and $R^{f1}$ represents a monovalent chain-like hydrocarbon group that is substituted with a fluorine atom, or a monovalent alicyclic hydrocarbon group that is substituted with a fluorine atom.

Examples of the monovalent chain-like hydrocarbon group that is substituted with a fluorine atom represented by $R^{f1}$ in the formula (f-1) include a group obtained by substituting 1 to 10 hydrogen atoms of a chain-like hydrocarbon group having 1 to 30 carbon atoms with a fluorine atom.

Examples of the monovalent alicyclic hydrocarbon group that is substituted with a fluorine atom represented by $R^{f1}$ include a group obtained by substituting 1 to 10 hydrogen atoms of an alicyclic hydrocarbon group having 3 to 30 carbon atoms with a fluorine atom.

The group represented by $R^{f1}$ is preferably a monoperfluoroalkylmethyl group having 2 to 5 carbon atoms or a diperfluoroalkylmethyl group having 3 to 5 carbon atoms. This ensures that the surface of the resist film exhibits improved hydrophobicity, and a problem that may occur during liquid immersion lithography (e.g., elution of the resist film composition or occurrence of defects) can be advantageously suppressed.

Specific examples of the monovalent chain-like hydrocarbon group that is substituted with a fluorine atom represented by $R^m$ include those mentioned above in connection with $R^{f1}$, and perfluoroalkyl groups having 1 to 4 carbon atoms.

Specific examples of the repeating unit (f1) include the repeating units disclosed in paragraphs [0214] and [0215] of Japanese Patent Application Publication (KOKAI) No. 2007-304537, and repeating units shown by the following formulas.

[Chemical Formula 19]

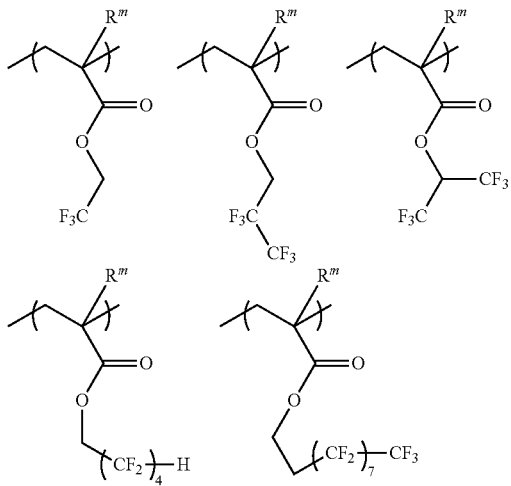

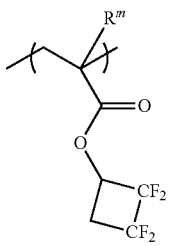
-continued wherein $R^m$ is the same as defined for the formula (f-1).

<Repeating Unit (f2)>

A structural unit shown by the following formula (f-2) is also preferable as the repeating unit (f).

[Chemical Formula 20]

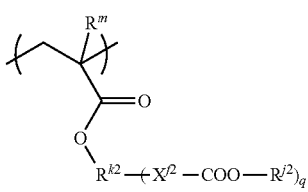
(f-2)

wherein $R^m$ is the same as defined for the formula (f-1), $R^{k2}$ represents a (q+1)-valent linking group, $X^{f2}$ represents a divalent linking group that includes at least one fluorine atom, $R^{j2}$ represents a hydrogen atom or a monovalent organic group, and q is an integer from 1 to 3, provided that a plurality of $X^{f2}$ and a plurality of $R^{j2}$ may respectively be either the same or different when q is 2 or 3.

Examples of the (q+1)-valent linking group represented by $R^{k2}$ in the formula (f-2) include a (q+1)-valent hydrocarbon group having 1 to 20 carbon atoms. The methylene group of the (q+1)-valent hydrocarbon group having 1 to 20 carbon atoms may be substituted with an oxygen atom, a sulfur atom, —NR'— (wherein R' represents a hydrogen atom or a monovalent organic group), a carbonyl group, —CO—O—, or —CO—NH—. The (q+1)-valent linking group represented by $R^{k2}$ may include a lactone structure. The (q+1)-valent hydrocarbon group represented by $R^{k2}$ may be a chain-like hydrocarbon group, an alicyclic hydrocarbon group, an aromatic hydrocarbon group, or a combination thereof. The (q+1)-valent hydrocarbon group represented by $R^{k2}$ may be saturated or unsaturated.

$X^{f2}$ preferably represents a divalent chain-like hydrocarbon group having 1 to 20 carbon atoms that is substituted with at least one fluorine atom. Specific examples of the divalent chain-like hydrocarbon group represented by $X^{f2}$ include the groups shown by the following formulas (X2-1) to (X2-6).

[Chemical Formula 21]

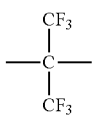
(X2-1)

-continued

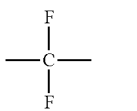
(X2-2)

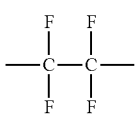
(X2-3)

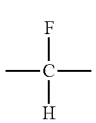
(X2-4)

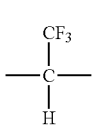
(X2-5)

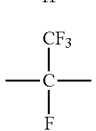
(X2-6)

Examples of the monovalent organic group represented by $R^{j2}$ include an acid-labile group, an alkali-labile group, and a substituted or unsubstituted hydrocarbon group having 1 to 30 carbon atoms. The term "acid-labile group" used herein refers to a group that substitutes a hydrogen atom of a polar group (e.g., hydroxyl group or carboxyl group), and dissociates due to an acid. The term "alkali-labile group" used herein refers to a group that substitutes a hydrogen atom of a polar group (e.g., hydroxyl group or carboxyl group), and dissociates due to a base.

The acid-labile group represented by $R^{j2}$ is not particularly limited, but is preferably a structural unit that does not include an aromatic ring (e.g., a structural unit that differs from the repeating unit (a1)). Specific examples of the acid-labile group include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like. Examples of the alkoxy group (substituent) of the alkoxy-substituted methyl group include alkoxy groups having 1 to 4 carbon atoms. Examples of the alkyl group (substituent) of the alkylsulfanyl-substituted methyl group include alkyl groups having 1 to 4 carbon atoms.

A group shown by the following formula (Y-1) is preferable as the acid-labile group.

[Chemical Formula 22]

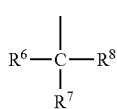
(Y-1)

wherein $R^6$ represents an alkyl group having 1 to 4 carbon atoms or a monovalent alicyclic hydrocarbon group having 4 to 20 carbon atoms, and $R^7$ and $R^8$ individually represent an alkyl group having 1 to 4 carbon atoms or an alicyclic hydrocarbon group having 4 to 20 carbon atoms, or bond to each other to form a divalent alicyclic hydrocarbon group having 4 to 20 carbon atoms together with the carbon atom bonded to $R^7$ and $R^8$.

The group shown by the formula (Y-1) is preferably a t-butyl group from the viewpoint of ease of synthesis. Alternatively, the group shown by the formula (Y-1) is preferably a group that includes a cycloalkane skeleton since the shape of the resist pattern obtained by development can be further improved. Specific examples of the group shown by the formula (Y-1) that includes a cycloalkane skeleton include groups shown by the following formulas (Y1-1) to (Y1-4).

[Chemical Formula 23]

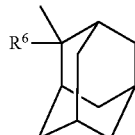
(Y1-1)

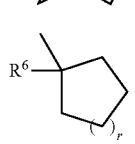
(Y1-2)

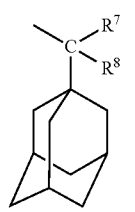
(Y1-3)

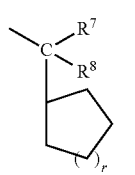
(Y1-4)

wherein r is an integer from 0 to 8.

Specific examples of the alkali-labile group represented by $R^{j2}$ include groups shown by the following formulas (Z-1) to (Z-3).

[Chemical Formula 24]

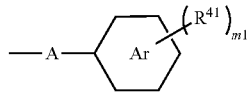
(Z-1)

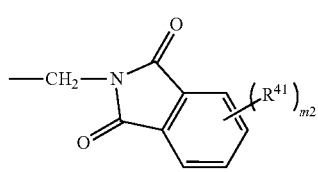
(Z-2)

(Z-3)

wherein the following formula represents an aromatic hydrocarbon group,

[Chemical Formula 25]

A represents a single bond or —CH$_2$—, R$^{41}$ represents a substituent, provided that a plurality of R$^{41}$ may be either the same or different when a plurality of R$^{41}$ are present, m1 is an integer from 0 to 5, m2 is an integer from 0 to 4, and R$^{42}$ and R$^{43}$ individually represent a hydrogen atom or an alkyl group having 1 to 10 carbon atoms that may be substituted with a fluorine atom, provided that R$^{42}$ and R$^{43}$ may bond to each other to form an alicyclic hydrocarbon structure having 4 to 20 carbon atoms.

The number of carbon atoms of the ring skeleton of the aromatic hydrocarbon group represented by the following formula in the formula (Z-1) is preferably 6 to 10. Specific examples of such a ring skeleton include a benzene ring and a naphthalene ring.

[Chemical Formula 26]

Examples of the substituent represented by R$^{41}$ in the formulas (Z-1) and (Z-2) include —R$^{P1}$, —R$^{P2}$—O—R$^{P1}$, R$^{P2}$—CO—R$^{P1}$, —R$^{P2}$—CO—OR$^{P1}$, —R$^{P2}$—O—CO—R$^{P1}$, R$^{P2}$—OH, —R$^{P2}$—CN, —R$^{P2}$—COOH (wherein R$^{P1}$ represents a monovalent chain-like saturated hydrocarbon group having 1 to 10 carbon atoms, a monovalent alicyclic saturated hydrocarbon group having 3 to 20 carbon atoms, or a monovalent aromatic hydrocarbon group having 6 to 30 carbon atoms, provided that some or all of the hydrogen atoms of these groups may be substituted with a fluorine atom, and R$^{P2}$ represents a single bond, a divalent chain-like saturated hydrocarbon group having 1 to 10 carbon atoms, a divalent alicyclic saturated hydrocarbon group having 3 to 20 carbon atoms, a divalent aromatic hydrocarbon group having 6 to 30 carbon atoms, or a group obtained by substituting some or all of the hydrogen atoms of these groups with a fluorine atom), a fluorine atom, and the like. R$^{41}$ preferably represents a monovalent hydrocarbon group that is substituted with a fluorine atom, or a fluorine atom.

Specific examples of a preferable group shown by the formula (Z-3) include a methyl group, an ethyl group, a 1-propyl group, a 2-propyl group, a 1-butyl group, and a 2-butyl group.

q in the formula (f-2) is an integer from 1 to 3. Therefore, the repeating unit (f2) includes one, two, or three groups "—X$^{f2}$—COO—R$^{j2}$". When q is 2 or 3, a plurality of groups "—X$^{f2}$—COO—R$^{j2}$" may be bonded to an identical carbon atom included in the (q+1)-valent linking group represented by R$^{k2}$, or may be bonded to different carbon atoms included in the (q+1)-valent linking group represented by R$^{k2}$.

Specific examples of the repeating unit (f2) include the repeating units disclosed in Japanese Patent Application Publication (KOKAI) No. 2009-019199, the repeating units disclosed in Japanese Patent Application Publication (KOKAI) No. 2009-074085, repeating units shown by the following formulas (5-1a) and (5-1b), and the like.

[Chemical Formula 27]

(5-1a)

(5-1b)

wherein R$^{53}$ represents a divalent linear, branched, or cyclic saturated or unsaturated hydrocarbon group having 1 to 20 carbon atoms, and X$^{f2}$, R$^{j2}$, and q are the same as defined for the formula (f-2), provided that a plurality of X$^{f2}$ and a plurality of R$^{j2}$ may respectively be either the same or different when q is 2 or 3.

Specific examples of the repeating unit (f2) include repeating units shown by the following formulas (5p-1) to (5p-7).

[Chemical Formula 28]

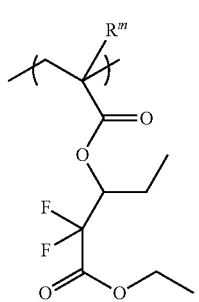

(5p-1)

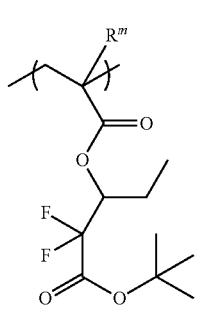

(5p-2)

-continued (5p-3)
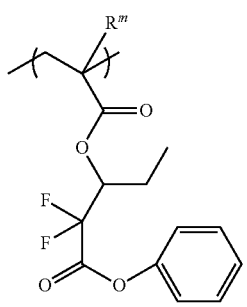

(5p-4)
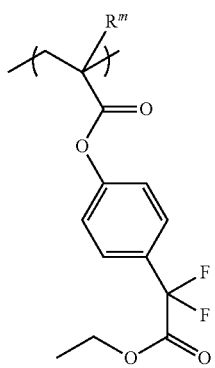

(5p-5)
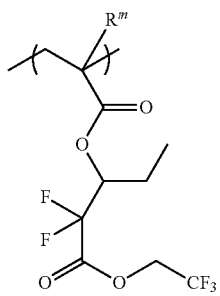

(5p-6)
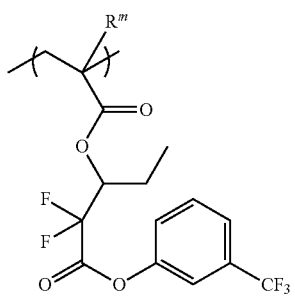

(5p-7)
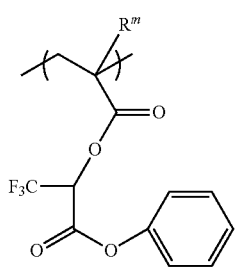

wherein $R^m$ is the same as defined for the formula (f-2).

<Repeating Unit (f3)>

A structural unit shown by the following formula (f-3) is also preferable as the repeating unit (f).

[Chemical Formula 29]

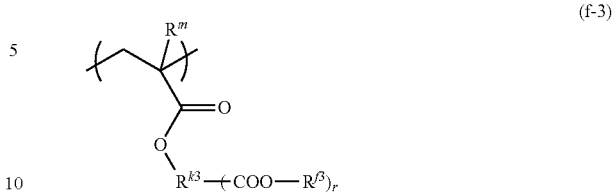

(f-3)

wherein $R^m$ and $R^{f3}$ are the same as defined for $R^m$ and $R^{f1}$ in the formula (f-1), and $R^{k3}$ and r are the same as defined for $R^{k2}$ and q in the formula (f-2), provided that a plurality of $R^{f3}$ may be either the same or different when r is 2 or 3.

Specific examples of the linking group represented by $R^{k3}$ in the formula (f-3) include those mentioned above in connection with $R^{k2}$ in the formula (f-2). Specific examples of the group represented by $R^{f3}$ include those mentioned above in connection with $R^{f1}$ in the formula (f-1). $R^{f3}$ preferably represents a chain-like hydrocarbon group having 1 to 6 carbon atoms that is substituted with a fluorine atom, or an alicyclic hydrocarbon group having 4 to 20 carbon atoms that is substituted with a fluorine atom.

r in the formula (f-3) is an integer from 1 to 3. Therefore, the repeating unit (f3) includes one, two, or three groups "—COO—$R^{f3}$". When r is 2 or 3, a plurality of groups "—COO—$R^{f3}$" may be bonded to an identical carbon atom included in the (q+1)-valent linking group represented by $R^{k3}$, or may be bonded to different carbon atoms included in the (q+1)-valent linking group represented by $R^{k3}$.

Specific examples of the repeating unit (f3) include the repeating units disclosed in Japanese Patent Application Publication (KOKAI) No. 2010-032994 (particularly (c-1-3) in paragraph [0152], and paragraphs [0155] and [0159] to [0162]), the repeating units disclosed in paragraphs [0063] to [0071] of Japanese Patent Application Publication (KOKAI) No. 2008-111103, repeating units shown by the following formulas (6-1a) and (6-1b), and the like.

[Chemical Formula 30]

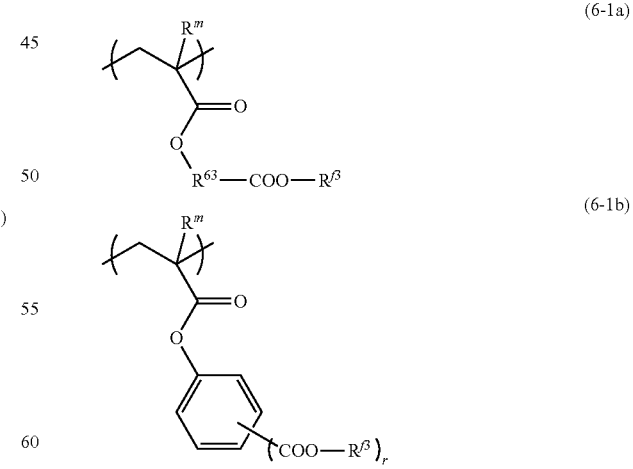

wherein $R^{63}$ represents a divalent linear, branched, or cyclic saturated or unsaturated hydrocarbon group having 1 to 20 carbon atoms, and $R^m$, $R^{f3}$, and r are the same as defined for the formula (f-3), provided that a plurality of $R^{f3}$ may be either the same or different when r is 2 or 3.

Specific examples of the repeating unit (f3) include repeating units shown by the following formulas (6p-1) to (6p-7).

[Chemical Formula 31]

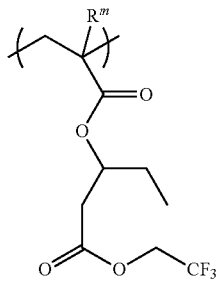

(6p-1)

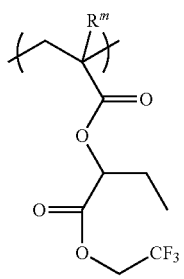

(6p-2)

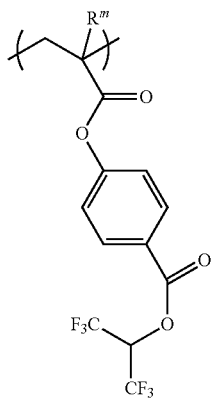

(6p-3)

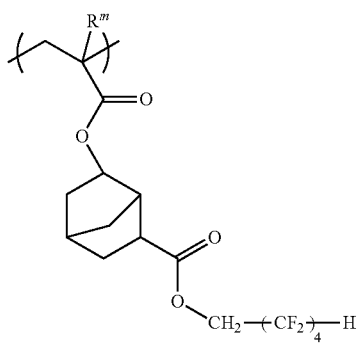

(6p-4)

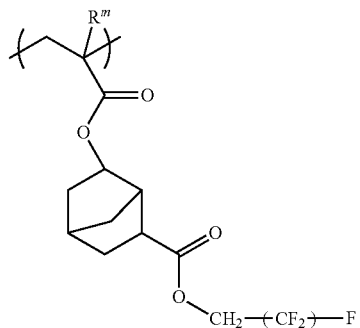

(6p-5)

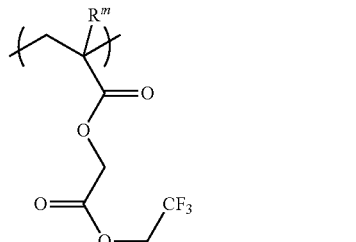

(6p-6)

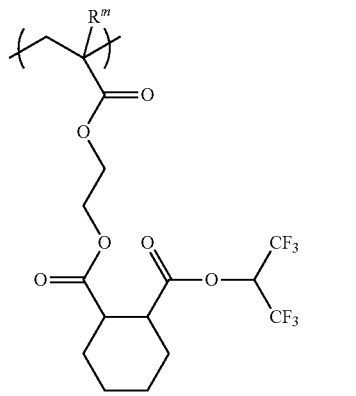

(6p-7)

wherein $R^m$ is the same as defined for the formula (f-3).

<Repeating Unit (f4)>

The polymer (A) may include a repeating unit shown by the following formula (f-4) as the repeating unit (f).

[Chemical Formula 32]

$$\{CH_2-CR^m\}-C(=O)-O-R^{k4}-(X^{f4}-O-R^{j4})_m$$

(f-4)

wherein $R^m$ is the same as defined for the formula (f-1), and $R^{k4}$, $X^{f4}$, $R^{j4}$, and m are the same as defined for $R^{k2}$, $X^{f2}$, $R^{j2}$, and q in the formula (f-2), provided that a plurality of $R^{k4}$ may be either the same or different when m is 2 or 3.

Specific examples of the linking group represented by $R^{k4}$ in the formula (f-4) include those mentioned above in connection with $R^{k2}$ in the formula (f-2). Specific examples of the group represented by $X^{f4}$ include those mentioned above in connection with $X^{f2}$ in the formula (f-2). The group represented by $X^{f4}$ is preferably the group shown by the formula (X2-1). Specific examples of the group represented by $R^{j4}$ include those mentioned above in connection with $R^{j2}$ in the formula (f-2). Examples of the acid-labile group represented by $R^{j4}$ include those mentioned above in connection with $R^{j2}$ in the formula (f-2) (excluding the group shown by the formula (Y-1)). Among these, a t-butoxycarbonyl group and an alkoxy-substituted methyl group are preferable.

Examples of the alkali-labile group represented by $R^{j4}$ include a group shown by the following formula (W-1).

[Chemical Formula 33]

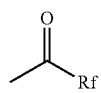

(W-1)

wherein Rf is the same as defined for $R^{f1}$ in the formula (f-1).

m in the formula (f-4) is an integer from 1 to 3. Therefore, the repeating unit (f4) includes one, two, or three groups "—$X^{f4}$—O—$R^{j4}$". When m is 2 or 3, a plurality of groups "$X^{f4}$—O—$R^{j4}$" may be bonded to an identical carbon atom included in the (q+1)-valent linking group represented by $R^{k4}$, or may be bonded to different carbon atoms included in the (q+1)-valent linking group represented by $R^{k4}$.

Specific examples of the repeating unit (f4) include the repeating units disclosed in Japanese Patent Application Publication (KOKAI) No. 2007-204385 (particularly repeating units derived from the monomers described in paragraphs [0040], [0041], [0061], and [0077]). Specific examples of the repeating unit (a4) are shown below.

[Chemical Formula 34]

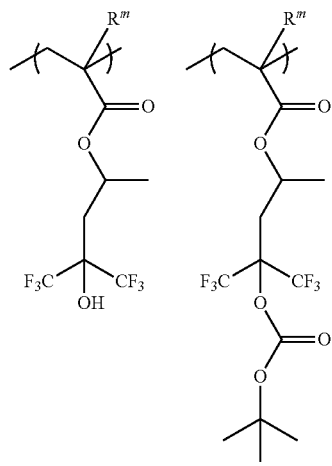

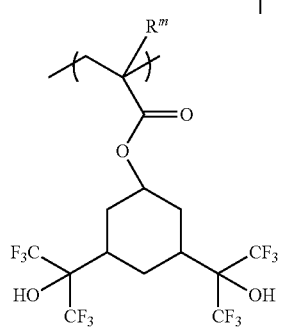

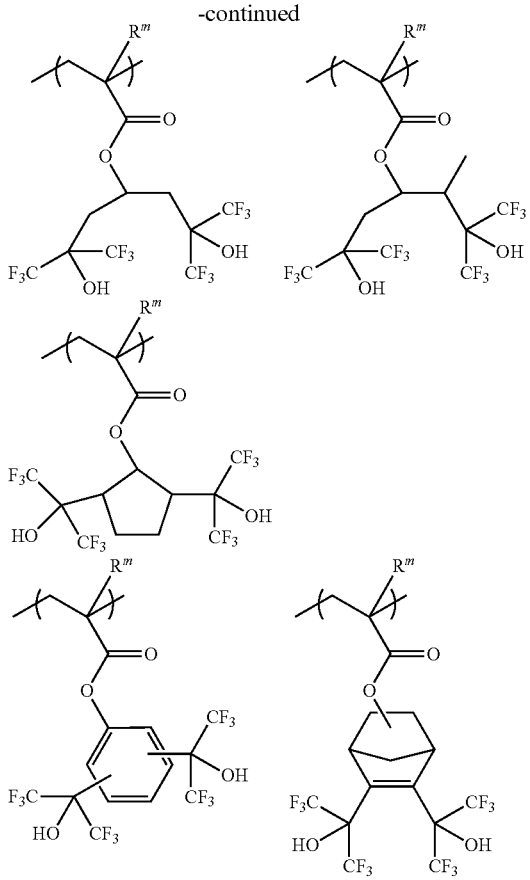

-continued

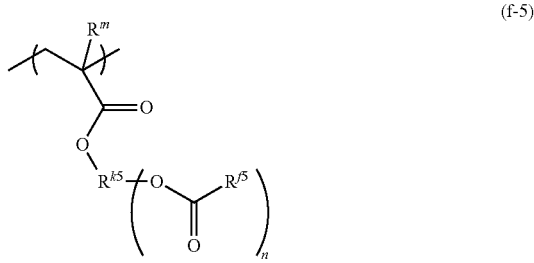

wherein $R^m$ is the same as defined for the formula (f-4).

<Repeating Unit (f5)>

The polymer (A) may include a repeating unit shown by the following formula (f-5) as the repeating unit (f).

[Chemical Formula 35]

(f-5)

wherein $R^m$ and $R^{f5}$ are the same as defined for $R^m$ and $R^{f1}$ in the formula (f-1), n is the same as defined for q in the formula (f-2), and $R^{k5}$ represents an (n+1)-valent linking group, provided that a plurality of $R^{f5}$ may be either the same or different when n is 2 or 3.

Specific examples of the (n+1)-valent linking group represented by $R^{k5}$ in the formula (f-5) include those mentioned above in connection with $R^{k2}$ in the formula (f-2).

Specific examples of the group represented by $R^{f5}$ include those mentioned above in connection with $R^{f1}$ in the formula (f-1). The group represented by $R^{f5}$ is preferably a perfluoroalkyl group having 1 to 5 carbon atoms, a monoperfluoroalkylmethyl group having 2 to 5 carbon atoms, or a diperfluoroalkylmethyl group having 3 to 5 carbon atoms, and more preferably a trifluoromethyl group or a perfluoropropyl group.

n in the formula (f-5) is an integer from 1 to 3. Therefore, the repeating unit (f5) includes one, two, or three groups "—O—CO—$R^{f5}$". When n is 2 or 3, a plurality of groups "—O—CO—$R^{f5}$" may be bonded to an identical carbon atom included in the (n+1)-valent linking group represented by $R^{k5}$, or may be bonded to different carbon atoms included in the (n+1)-valent linking group represented by $R^{k5}$.

Specific examples of the repeating unit (f5) include repeating units shown by the following formulas (f5-1) to (f5-7).

[Chemical Formula 36]

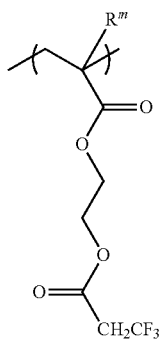
(f5-1)

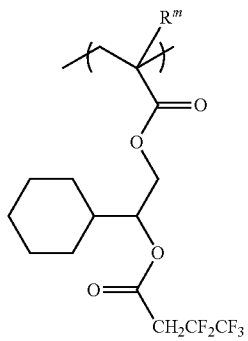
(f5-2)

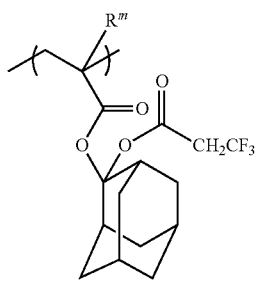
(f5-3)

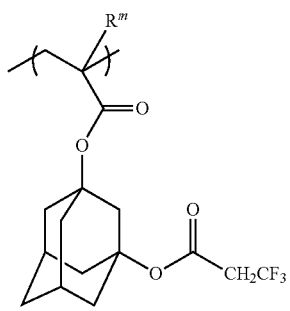
(f5-4)

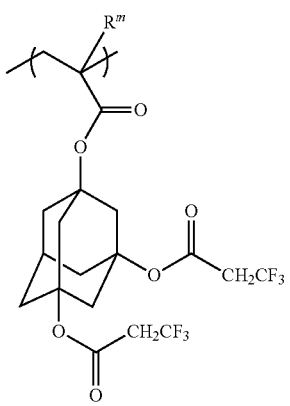
(f5-5)

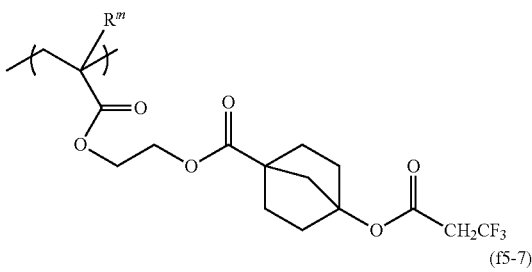
(f5-6)

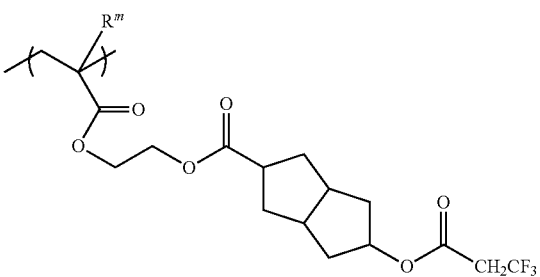
(f5-7)

wherein $R^m$ is the same as defined for the formula (f-5).

The repeating units (f1), (f2), (f3), and (f5) are preferable as the repeating unit (f). The repeating units (f2), (f3), and (f5) are more preferable as the repeating unit (f). The repeating units (f2) and (f3) are still more preferable as the repeating unit (f). Since the repeating units (f2) and (f3) react with an alkaline developer to produce a carboxyl group, the repeating units (f2) and (f3) exhibit high solubility in a developer as compared with the repeating units (f1) and (f4) that do not produce a polar group and the repeating unit (f5) that produces a hydroxyl group. Therefore, a situation in which the exposed area rarely remains undeveloped rarely occurs, and defects such as bridge defects can be advantageously suppressed.

The content of the repeating unit (f) in the polymer (A) is preferably 95 mol % or less, and more preferably 5 to 95 mol %, based on the total repeating units included in the polymer (A). If the content of the repeating unit (f) is 5 mol % or more, the surface of the resist film exhibits sufficiently high hydrophobicity, so that a problem that may occur during liquid immersion lithography (e.g., elution of the resist film composition or occurrence of defects) can be suppressed. If the content of the repeating unit (f) is 95 mol % or less, the surface of the resist film does not exhibit too high a hydrophobicity (i.e., defects can be advantageously suppressed). Note that the polymer (A) may include only one type of repeating unit (f), or may include two or more types of repeating unit (f).

<Additional Repeating Unit>

The polymer (A) may include the following repeating units (Ac), (aL), (Lc), and the like as developer-soluble units other than the repeating units (a1) and (f).

<Repeating Unit (Ac)>

The polymer (A) may include the repeating unit (Ac) shown by the following formula (7). Specifically, the polymer (A) may include a group that differs from the group shown by the formula (1) or (2) as an acid-labile group, and the hydrogen of a carboxyl group may be substituted with the acid-labile group.

[Chemical Formula 37]

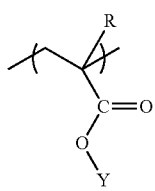

(7)

wherein R represents a hydrogen atom, a fluorine atom, or a monovalent chain-like hydrocarbon group that may be substituted with a fluorine atom, and Y represents an acid-labile group.

Examples of the acid-labile group represented by Y include the group shown by the formula (Y-1). Specific examples of the repeating unit (Ac) include repeating units shown by the following formulas (7-1) to (7-4).

[Chemical Formula 38]

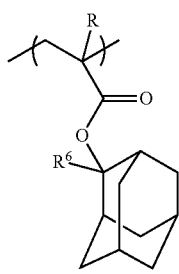

(7-1)

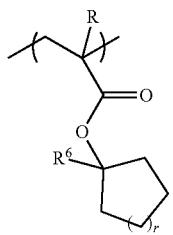

(7-2)

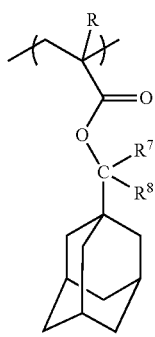

(7-3)

-continued

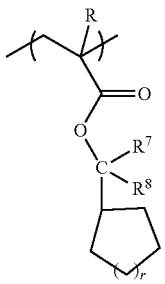

(7-4)

wherein R is the same as defined for the formula (7), $R^6$, $R^7$, and $R^8$ are the same as defined for the formula (Y-1), and r is an integer from 0 to 8.

The content of the repeating unit (Ac) in the polymer (A) is normally 80 mol % or less, preferably 0 to 70 mol %, and more preferably 0 to 60 mol %, based on the total repeating units included in the polymer (A). Note that the polymer (A) may include only one type of repeating unit (Ac), or may include two or more types of repeating unit (Ac).

<Repeating Unit (aL)>

The polymer (A) may include the repeating unit (aL) that includes an alkali-soluble group. The alkali-soluble group included in the repeating unit (aL) is preferably a functional group that includes a hydrogen atom having an acid dissociation constant pKa of 4 to 11 from the viewpoint of an improvement in solubility in a developer. Specific examples of such a functional group include functional groups shown by the following formulas (8s-1) and (8s-2), and the like.

[Chemical Formula 39]

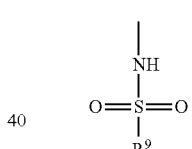

(8s-1)

(8s-2)

wherein $R^9$ represents a hydrocarbon group having 1 to 10 carbon atoms that is substituted with at least one fluorine atom.

The hydrocarbon group having 1 to 10 carbon atoms that is substituted with at least one fluorine atom represented by $R^9$ in the formula ($8s^{-1}$) is not particularly limited as long as the hydrocarbon group is obtained by substituting some or all of the hydrogen atoms of a hydrocarbon group having 1 to 10 carbon atoms with a fluorine atom. For example, $R^9$ preferably represents a trifluoromethyl group or the like.

Specific examples of the repeating unit (aL) include a structural unit derived from (meth)acrylic acid, the repeating units disclosed in paragraphs [0018] to [0022] of WO2009/041270, the repeating units disclosed in paragraph [0034] of WO2009/041270, and the repeating units disclosed in paragraph [0015] of WO2006/035790.

The content of the repeating unit (aL) in the polymer (A) is normally 50 mol % or less, preferably 0 to 30 mol %, and more preferably 0 to 20 mol %, based on the total repeating units included in the polymer (A). Note that the polymer (A) may include only one type of repeating unit (aL), or may include two or more types of repeating unit (aL).

<Repeating Unit (Lc)>

The polymer (A) may include the repeating unit (Lc) shown by the following formula (9).

[Chemical Formula 40]

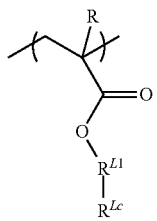

(9)

wherein $R^{L1}$ represents a single bond or a divalent linking group, $R^{Lc}$ represents a monovalent organic group that includes a lactone structure or a monovalent organic group that includes a cyclic carbonate structure, and R is the same as defined for the formula (7).

Specific examples of the divalent linking group ($R^{L1}$) included in the formula (9) include those mentioned above in connection with the divalent linking group ($R^{k2}$) included in the repeating unit (f2), and the like.

Examples of the monovalent organic group that includes a lactone structure represented by $R^{Lc}$ in the formula (9) include groups shown by the following formulas (Lc-1) to (Lc-6).

[Chemical Formula 41]

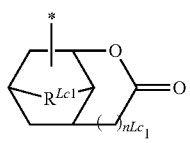

(Lc-1)

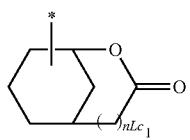

(Lc-2)

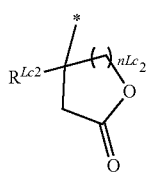

(Lc-3)

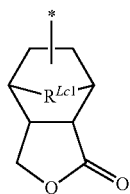

(Lc-4)

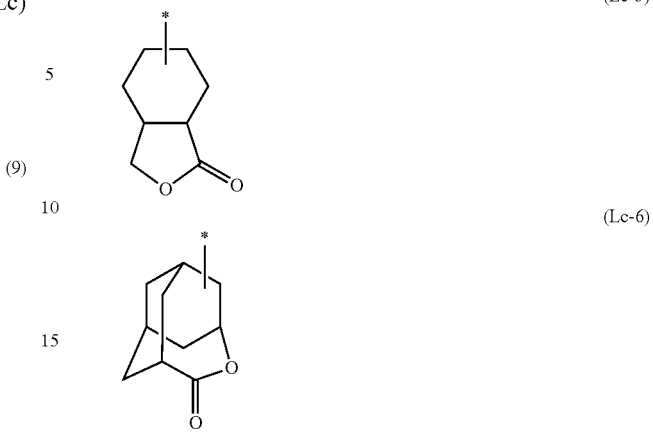

(Lc-5)

(Lc-6)

wherein $R^{Lc1}$ represents an oxygen atom or a methylene group, $R^{Lc2}$ represents a hydrogen atom or an alkyl group having 1 to 4 carbon atoms, $n_{Lc1}$ is 0 or 1, $n_{Lc2}$ is an integer from 0 to 3, and "*" indicates a bonding hand bonded to $R^{L1}$ in the formula (9). Note that the groups shown by the formulas (Lc-1) to (Lc-6) may be substituted with a substituent.

Examples of a substituent that may substitute the groups shown by the formulas (Lc-1) to (Lc-6) include those mentioned above in connection with $R^{41}$ in the formulas (Z-1) and (Z-2).

Specific examples of the repeating unit (Lc) include the structural units disclosed in paragraphs [0054] to [0057] of Japanese Patent Application Publication (KOKAI) No. 2007-304537, the structural units disclosed in paragraphs [0086] to [0088] of Japanese Patent Application Publication (KOKAI) No. 2008-088343, and structural units shown by the following formulas (9-1a) to (9-1j).

[Chemical Formula 42]

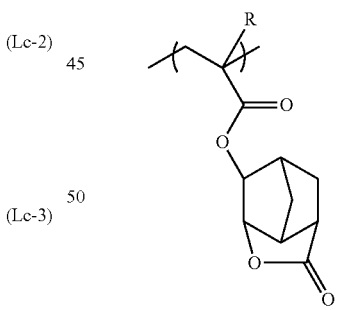

(9-1a)

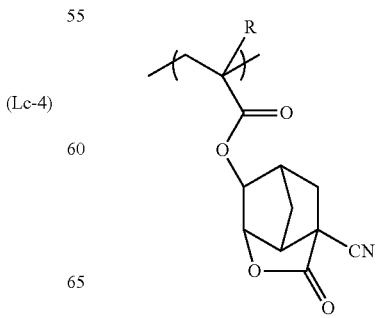

(9-1b)

(9-1c)
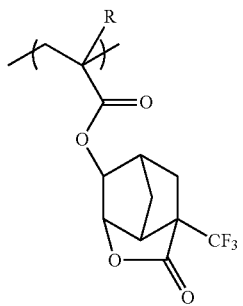
(9-1d)
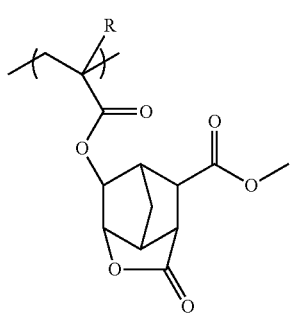
(9-1e)
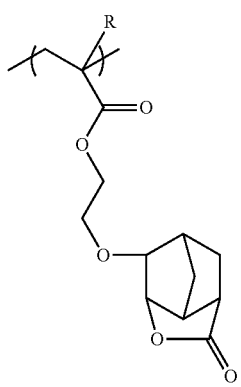
(9-1f)
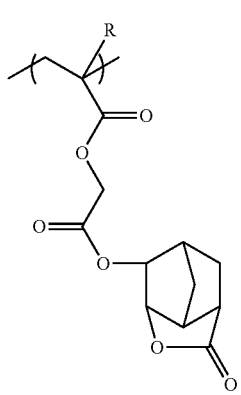
(9-1g)
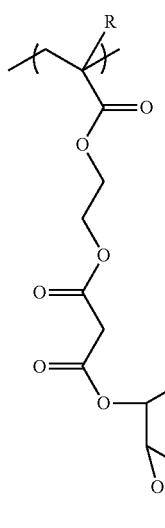
(9-1h)
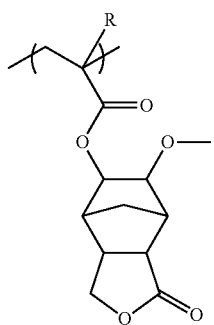
(9-1i)
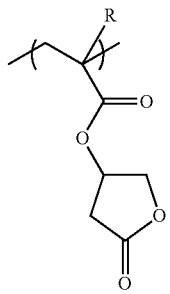
(9-1j)
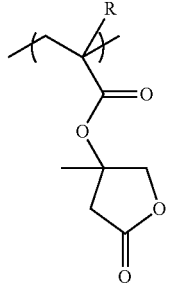
wherein R is the same as defined for the formula (7).
The polymer (A) may include only one type of repeating unit (Lc), or may include two or more types of repeating unit (Lc). Examples of a preferable monomer that produces the repeating unit (Lc) include the monomers disclosed in paragraph [0043] of WO2007/116664.

Examples of the repeating unit (Lc) that includes a cyclic carbonate structure include a structural unit shown by the following formula (9-2a).

[Chemical Formula 43]

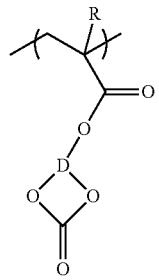

(9-2a)

wherein R is the same as defined for the formula (7), and D represents a trivalent chain-like hydrocarbon group having 1 to 30 carbon atoms, a trivalent alicyclic hydrocarbon group having 3 to 30 carbon atoms, or a trivalent aromatic hydrocarbon group having 6 to 30 carbon atoms. Note that the group represented by D may include an oxygen atom, a carbonyl group, or —NH— in the skeleton, and may be substituted with a substituent.

Examples of a substituent that may substitute the group represented by D include those mentioned above in connection with $R^{41}$ in the formulas (Z-1) and (Z-2).

The monomer that produces the repeating unit shown by the formula (9-2a) may be synthesized by the method disclosed in Tetrahedron Letters, Vol. 27, No. 32, p. 3741 (1986), Organic Letters, Vol. 4, No. 15, p. 2561 (2002), or the like.

Examples of a preferable repeating unit shown by the formula (9-2a) include the repeating units disclosed in paragraph [0020] of Japanese Patent Application Publication (KOKAI) No. 2010-066503. Examples of a more preferable repeating unit shown by the formula (9-2a) include repeating units shown by the following formulas (ω-1) and (9-2a-2).

[Chemical Formula 44]

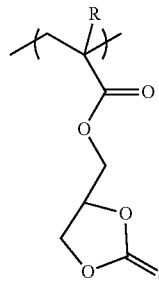

(9-2a-1)

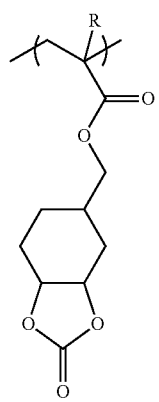

(9-2a-2)

wherein R is the same as defined for the formula (7).

The content of the repeating unit (Lc) in the polymer (A) is normally 50 mol % or less, preferably 0 to 40 mol %, and more preferably 0 to 20 mol %, based on the total repeating units included in the polymer (A). Note that the polymer (A) may include only one type of repeating unit (Lc), or may include two or more types of repeating unit (Lc).

The content of the polymer (A) in the radiation-sensitive resin composition is preferably 0.1 mass % or more and less than 20 mass % based on the total amount of polymers included in the radiation-sensitive resin composition. If the content of the polymer (A) is less than 0.1 mass %, the surface of the resist film may not exhibit sufficiently high hydrophobicity that suppresses a problem that may occur during liquid immersion lithography. If the content of the polymer (A) is 20 mass % or more, the resist film may remain undeveloped, or an index (e.g., line width roughness (LWR) or mask error factor (MEF)) that indicates the lithographic performance of the resist may be insufficient. The content of the polymer (A) is more preferably 1 to 17 mass %, still more preferably 1 to 15.5 mass %, and particularly preferably 1 to 15 mass %.

The polystyrene-reduced weight average molecular weight (hereinafter may be referred to as "Mw") of the polymer (A) determined by gel permeation chromatography (GPC) is not particularly limited, but is preferably 1000 to 50,000. If the Mw of the polymer (A) is 1000 or more, the polymer (A) tends to be unevenly distributed in the surface layer of the resist film. If the Mw of the polymer (A) is 50,000 or less, the polymer (A) is easily dissolved in a solvent. The Mw of the polymer (A) is more preferably 2000 to 40,000, and still more preferably 3000 to 30,000.

The ratio (Mw/Mn) of the Mw to the polystyrene-reduced number average molecular weight (hereinafter may be referred to as "Mn") of the polymer (A) determined by GPC is preferably 1.0 to 5.0, more preferably 1.0 to 4.0, and still more preferably 1.0 to 3.5.

The radiation-sensitive resin composition preferably includes 0.1 to 15 mol % of the repeating unit (a1) and 0.1 to 15 mol % of the repeating unit (f) (excluding a repeating unit that falls under the repeating unit (a1)) based on the total repeating units included in the polymer component. If the content of each repeating unit is within the above range, the surface of the resist film exhibits appropriate hydrophobicity during liquid immersion lithography, and an excellent patterning capability can be obtained.

<Method of Producing Polymer (A)>

The polymer (A) may be synthesized by radical polymerization or the like. For example, the polymer (A) is preferably synthesized by (1) adding a solution containing a monomer and a radical initiator dropwise to a reaction solvent or a solution containing a monomer to effect polymerization, (2) adding a solution containing a monomer and a solution containing a radical initiator dropwise to a reaction solvent or a solution containing a monomer to effect polymerization, or (3) adding a plurality of solutions respectively containing a monomer and a solution containing a radical initiator dropwise to a reaction solvent or a solution containing a monomer to effect polymerization.

The reaction temperature may be appropriately determined depending on the type of initiator. The reaction temperature is normally 30 to 150° C., preferably 40 to 150° C., and more preferably 50 to 140° C. The dropwise addition time is determined depending on the reaction temperature, the type of initiator, the type of monomer, and the like, but is preferably 30 minutes to 8 hours, and more preferably 1 to 6 hours. The total reaction time including the dropwise addition time is determined depending on the above conditions, but is normally 30 minutes to 12 hours, preferably 45 minutes to 12 hours, and more preferably 1 to 10 hours.

Examples of the radical initiator used for polymerization include azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and dimethyl 2,2'-azobis(2-methylpropionate); peroxide radical initiators such as benzoyl peroxide, t-butyl hydroperoxide, and cumene hydroperoxide; and the like. These radical initiators may be used either individually or in combination. It is preferable to use AIBN.

A solvent that is not a solvent that hinders polymerization (e.g., nitrobenzene which has a polymerization inhibiting effect or a mercapto compound which has a chain transfer effect) and dissolves the monomers may be used as the polymerization solvent. Examples of such a solvent include alcohols, ethers, ketones, amides, ester-lactones, nitriles, a mixture thereof, and the like. These solvents may be used either individually or in combination.

The polymer obtained by polymerization is preferably collected by re-precipitation. Specifically, the polymer solution is poured into a re-precipitation solvent after completion of polymerization to collect the target polymer as a powder. An alcohol, an alkane, or the like may be used as the re-precipitation solvent either individually or in combination. The polymer may also be collected by removing low-molecular-weight components (e.g., monomer and oligomer) by a separation operation, a column operation, ultrafiltration, or the like.

<Polymer (B)>

The radiation-sensitive resin composition includes the polymer (B) that includes an acid-labile group in addition to the polymer (A). The polymer (B) that includes an acid-labile group changes in solubility in a developer due to an acid. Specifically, the polymer (B) is insoluble or scarcely soluble in an alkali, but becomes alkali-soluble upon dissociation (elimination) of the acid-labile group due to an acid generated by the acid generator (C) or the like.

The expression "insoluble or scarcely soluble in an alkali" used herein means that a film (thickness: 100 nm) that is formed only of the polymer (B) has a thickness equal to or more than 50% of the initial thickness when developed under alkaline conditions employed when forming a resist pattern using a resist film that is formed using the radiation-sensitive resin composition.

It is preferable that the polymer (B) does not include a fluorine atom, or have a fluorine atom content lower than that of the polymer (A). In this case, the polymer (A) is easily unevenly distributed in the surface layer of the resist film formed using the radiation-sensitive resin composition, so that the surface of the resist film more effectively exhibits hydrophobicity due to the polymer (A).

The structure of the polymer (B) is not particularly limited as long as the polymer (B) has the above properties. Specific examples of a repeating unit included in the polymer (B) include the repeating unit (f2) wherein $R^{j2}$ represents an acid-labile group, the repeating unit (f4) wherein $R^{j2}$ represents an acid-labile group, and the repeating unit (Ac) shown by the formula (7). Note that the polymer (B) may include only one type of each repeating unit, or may include two or more types of each repeating unit. It is preferable that the polymer (B) include a repeating unit that includes a cycloalkane skeleton (e.g., the repeating units shown by the formula (7-1) to (7-4)) since the shape of the resist pattern can be improved.

The polymer (B) preferably includes the repeating unit (Lc) shown by the formula (9). The content of the repeating unit (Lc) in the polymer (B) is preferably 5 to 75 mol %, more preferably 15 to 65 mol %, and still more preferably 15 to 55 mol %, based on the total repeating units included in the polymer (B). If the content of the structural unit (Lc) is 5 mol % or more, the pattern rarely peels off during development due to sufficient adhesion to a substrate. If the content of the structural unit (Lc) is 75 mol % or less, an excellent pattern shape can be obtained since a decrease in contrast after dissolution rarely occurs.

The resin (B) may include an additional repeating unit other than the above repeating units. Examples of a polymerizable unsaturated monomer that produces such an additional repeating unit include the monomers disclosed in paragraphs [0065] to [0085] of WO2007/116664A.

A structural unit derived from 2-hydroxyethyl(meth)acrylate, 2-hydroxypropyl (meth)acrylate, or 3-hydroxypropyl (meth)acrylate, and the repeating unit (f4) are preferable as the additional repeating (structural) unit.

The Mw of the polymer (B) is normally 3000 to 300,000, preferably 3000 to 200,000, and still more preferably 3000 to 100,000. If the Mw of the polymer (B) is less than 3000, the heat resistance of the resulting resist may deteriorate. If the Mw of the polymer (B) exceeds 300,000, the developability of the resulting resist may deteriorate.

<Acid Generator (C)>

Examples of the acid generator (C) included in the radiation-sensitive resin composition include onium salt compounds (e.g., sulfonium salts and iodonium salts), organic halogen compounds, and sulfone compounds (e.g., disulfones and diazomethanesulfones). The acid generator (C) may be included in the radiation-sensitive resin composition as a compound (described below) and/or an acid-generating group included in the polymer (A), the polymer (B), or the like.

Specific examples of a preferable acid generator (C) include the compounds disclosed in paragraphs [0080] to [0113] of Japanese Patent Application Publication (KOKAI) No. 2009-134088, and the like.

Specific examples of a preferable acid generator (C) include diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate,
triphenylsulfonium perfluoro-n-octanesulfonate,
cyclohexyl.2-oxocyclohexyl.methylsulfonium trifluoromethanesulfonate,
dicyclohexyl.2-oxocyclohexylsulfonium trifluoromethanesulfonate,
2-oxocyclohexyldimethylsulfonium trifluoromethanesulfonate,
4-hydroxy-1-naphthyldimethylsulfonium trifluoromethanesulfonate,
4-hydroxy-1-naphthyltetrahydrothiophenium trifluoromethanesulfonate,
4-hydroxy-1-naphthyltetrahydrothiophenium nonafluoro-n-butanesulfonate,
4-hydroxy-1-naphthyltetrahydrothiophenium perfluoro-n-octanesulfonate,
1-(1-naphthylacetomethyl)tetrahydrothiophenium trifluoromethanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate,
1-(3,5-dimethyl-4-hydroxyphenyl)tetrahydrothiophenium trifluoromethanesulfonate, 1-(3,5-dimethyl-4-hydroxyphenyl)tetrahydrothiophenium
nonafluoro-n-butanesulfonate,
1-(3,5-dimethyl-4-hydroxyphenyl)tetrahydrothiophenium
perfluoro-n-octanesulfonate,
trifluoromethanesulfonylbicyclo[2.2.1]hept-5-ene-2,3-di-
carbodiimide,
nonafluoro-n-butanesulfonylbicyclo[2.2.1]hept-5-ene-2,3-
dicarbodiimide,
perfluoro-n-octanesulfonylbicyclo[2.2.1]hept-5-ene-2,3-di-
carbodiimide,
N-hydroxysuccinimidetrifluoromethanesulfonate,
N-hydroxysuccinimidenonafluoro-n-butanesulfonate,
N-hydroxysuccinimideperfluoro-n-octanesulfonate, 1,8-
naphthalenedicarboxylic acid imide trifluoromethane-
sulfonate, and triphenylsulfonium
1,1-difluoro-2-adamantylethanesulfonate.

These compounds may be used either individually or in combination as the acid generator (C). The acid generator (C) is preferably used in an amount of 0.1 to 30 parts by mass, and more preferably 0.1 to 20 parts by mass, based on 100 parts by mass of the polymers included in the radiation-sensitive resin composition, so that the resulting resist exhibits excellent sensitivity and developability. If the amount of the acid generator is less than 0.1 parts by mass, a decrease in sensitivity and developability may occur. If the amount of the acid generator exceeds 30 parts by mass, a rectangular resist pattern may not be obtained due to a decrease in transparency to radiation.

<Acid Diffusion Controller (D)>

The radiation-sensitive resin composition may optionally include the acid diffusion controller (D). Examples of the acid diffusion controller (D) include a compound shown by the following formula (11) (hereinafter referred to as "nitrogen-containing compound (I)"), a compound that includes two nitrogen atoms in the molecule (hereinafter referred to as "nitrogen-containing compound (II)"), a compound that includes three or more nitrogen atoms in the molecule (hereinafter referred to as "nitrogen-containing compound (III)"), an amide group-containing compound, a urea compound, a nitrogen-containing heterocyclic compound, and the like. The acid diffusion controller improves the pattern shape and the dimensional accuracy of the resulting resist. The acid diffusion controller (D) may be included in the radiation-sensitive resin composition as a compound (described below) and/or an acid diffusion-controlling group included in the polymer (A), the polymer (C), or the like.

[Chemical Formula 45]

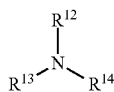

(11)

wherein $R^{12}$ to $R^{14}$ individually represent a hydrogen atom, a substituted or unsubstituted linear, branched, or cyclic alkyl group, an aryl group, or an aralkyl group.

Examples of the nitrogen-containing compound (I) include monoalkylamines such as n-hexylamine; dialkylamines such as di-n-butylamine; trialkylamines such as triethylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include polyethyleneimine, polyallylamine, poly(dimethylaminoethylacrylamide), and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include pyridines such as pyridine and 2-methylpyridine, pyrazine, pyrazole, and the like.

A compound that includes an acid-labile group may also be used as the nitrogen-containing organic compound.

Examples of the nitrogen-containing organic compound that includes an acid-labile group include N-(t-butoxycarbonyl)piperidine,
N-(t-butoxycarbonyl)imidazole, N-(t-butoxycarbonyl)benzimidazole,
N-(t-butoxycarbonyl)-2-phenylbenzimidazole, N-(t-butoxycarbonyl)di-n-octylamine,
N-(t-butoxycarbonyl)diethanolamine, N-(t-butoxycarbonyl)dicyclohexylamine,
N-(t-butoxycarbonyl)diphenylamine, N-(t-butoxycarbonyl)-4-hydroxypiperidine,
N-(t-amyloxycarbonyl)-4-hydroxypiperidine, and the like.

A compound shown by the following formula (12) may also be used as the acid diffusion controller.

$$X^+Z^- \qquad (12)$$

wherein $X^+$ represents a cation shown by the following formula (12-1-1) or (12-1-2), and $Z^-$ represents $OH^-$, an anion shown by $R^{D1}$—$COO^-$, an anion shown by $R^{D1}$—$SO_3^-$, or an anion shown by $R^{D1}$—$N^-$—$SO_2$—$R^{D2}$ (wherein $R^{D1}$ represents a substituted or unsubstituted alkyl group, a substituted or unsubstituted monovalent alicyclic hydrocarbon group, or a substituted or unsubstituted aryl group, and $R^{D2}$ represents an alkyl group in which some or all of the hydrogen atoms are substituted with a fluorine atom, or a monovalent alicyclic hydrocarbon group).

[Chemical Formula 46]

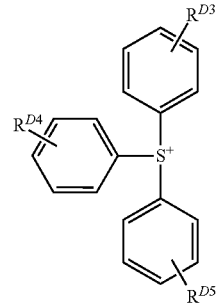

(12-1-1)

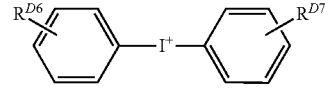

(12-1-2)

wherein $R^{D3}$ to $R^{D5}$ individually represent a hydrogen atom, an alkyl group, an alkoxy group, a hydroxyl group, or a halogen atom, and $R^{D6}$ and $R^{D7}$ individually represent a hydrogen atom, an alkyl group, an alkoxy group, a hydroxyl group, or a halogen atom.

The above compound is used as an acid diffusion controller that loses acid diffusion controllability upon decomposition due to exposure (hereinafter may be referred to as "photodegradable acid diffusion controller"). The above compound allows diffusion of an acid in the exposed area, but controls diffusion of an acid in the unexposed area, so that the contrast between the exposed area and the unexposed area is improved (i.e., the boundary between the exposed area and the unexposed area becomes distinct). This is effective for reducing the LWR and the MEF of the radiation-sensitive resin composition.

$X^+$ in the formula (12) represents the cation shown by the formula (12-1-1) or (12-1-2). $R^{D3}$ to $R^{D5}$ in the formula (12-1-1) individually represent a hydrogen atom, an alkyl group, an alkoxy group, a hydroxyl group, or a halogen atom. $R^{D3}$ to $R^{D5}$ preferably represent a hydrogen atom, an alkyl group, an alkoxy group, or a halogen atom since the solubility of the compound in a developer decreases. $R^{D6}$ and $R^{D7}$ in the formula (12-1-2) individually represent a hydrogen atom, an alkyl group, an alkoxy group, a hydroxyl group, or a halogen atom. $R^{D6}$ and $R^{D7}$ preferably represent a hydrogen atom, an alkyl group, or a halogen atom.

$Z^-$ in the formula (12) represents $OH^-$, an anion shown by $R^{D1}$—$COO^-$, an anion shown by $R^{D1}$—$SO_3^-$, or an anion shown by $R^{D1}$—$N^-$—$SO_2$—$R^{D2}$. $R^{D1}$ represents a substituted or unsubstituted alkyl group, a substituted or unsubstituted alicyclic hydrocarbon group, or a substituted or unsubstituted aryl group. $R^{D1}$ preferably represents an alicyclic hydrocarbon group or an aryl group since the solubility of the compound in a developer decreases.

Examples of the substituted or unsubstituted alkyl group represented by $R^{D1}$ include groups that include one or more substituents such as hydroxyalkyl groups having 1 to 4 carbon atoms such as a hydroxymethyl group; alkoxy groups having 1 to 4 carbon atoms such as a methoxy group; a cyano group; and cyanoalkyl groups having 2 to 5 carbon atoms such as a cyanomethyl group. Among these, a hydroxymethyl group, a cyano group, and a cyanomethyl group are preferable.

Examples of the substituted or unsubstituted alicyclic hydrocarbon group represented by $R^{D1}$ include monovalent groups derived from an alicyclic hydrocarbon such as a cycloalkane skeleton (e.g., hydroxycyclopentane, hydroxycyclohexane, or cyclohexanone), or a bridged alicyclic hydrocarbon skeleton (e.g., 1,7,7-trimethylbicyclo[2.2.1]heptan-2-one (camphor)). Among these, a group derived from 1,7,7-trimethylbicyclo[2.2.1]heptan-2-one is preferable.

Examples of the substituted or unsubstituted aryl group represented by $R^{D1}$ include a phenyl group, a benzyl group, a phenylethyl group, a phenylpropyl group, a phenylcyclohexyl group, and a group obtained by substituting these groups (compounds) with a hydroxyl group, a cyano group, or the like. Among these, a phenyl group, a benzyl group, and a phenylcyclohexyl group are preferable.

$Z^-$ in the formula (12) preferably represents the anion shown by the following formula (12-2-1) (i.e., an anion shown by $R^{D1}$—$COO^-$ wherein $R^{D1}$ represents a phenyl group), the anion shown by the following formula (12-2-2) (i.e., an anion shown by $R^{D1}$—$SO_3^-$ wherein $R^{D1}$ represents a group derived from 1,7,7-trimethylbicyclo[2.2.1]heptan-2-one), or the anion shown by the following formula (12-2-3) (i.e., an anion shown by $R^{D1}$—$N^-$—$SO_2$—$R^{D2}$ wherein $R^{D1}$ represents a butyl group, and $R^{D2}$ represents a trifluoromethyl group).

[Chemical Formula 47]

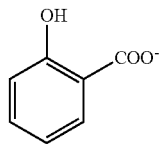
(12-2-1)

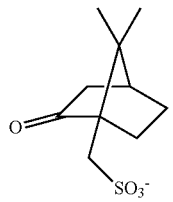
(12-2-2)

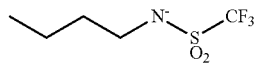
(12-2-3)

The photodegradable acid diffusion controller is shown by the formula (12). Specifically, the photodegradable acid diffusion controller is a sulfonium salt compound or an iodonium salt compound that satisfies the above conditions.

Examples of the sulfonium salt compound include triphenylsulfonium hydroxide, triphenylsulfonium salicylate, triphenylsulfonium 4-trifluoromethyl salicylate, diphenyl-4-hydroxyphenylsulfonium salicylate, triphenylsulfonium 10-camphorsulfonate, 4-t-butoxyphenyl.diphenylsulfonium 10-camphorsulfonate, and the like.
These sulfonium salt compounds may be used either individually or in combination.

Examples of the iodonium salt compound include bis(4-t-butylphenyl)iodonium hydroxide, bis(4-t-butylphenyl)iodonium salicylate, bis(4-t-butylphenyl)iodonium 4-trifluoromethyl salicylate, bis(4-t-butylphenyl)iodonium 10-camphorsulfonate, and the like. These iodonium salt compounds may be used either individually or in combination.

These compounds may be used either individually or in combination as the acid diffusion controller (D). The acid diffusion controller (D) is preferably used in an amount of 10 parts by mass or less, and more preferably 5 parts by mass or less, based on 100 parts by mass of the polymers included in the radiation-sensitive resin composition.

If the amount of the acid diffusion controller (D) is too large, the sensitivity of the resulting resist film may unduly decrease.

<Solvent (E)>

The radiation-sensitive resin composition normally includes the solvent (E). The solvent is not particularly limited as long as at least the polymer (A), the polymer (B), the acid generator (C), and the like can be dissolved therein. Examples of the solvent (E) include linear or branched ketones, cyclic ketones, propylene glycol monoalkyl ether acetates, alkyl 2-hydroxypropionates, alkyl 3-alkoxypropionates, and the like.

Among these, linear or branched ketones, cyclic ketones, propylene glycol monoalkyl ether acetates, alkyl 2-hydroxypropionates, alkyl 3-alkoxypropionates, and the like are preferable, and propylene glycol monomethyl ether acetate and cyclohexanone are more preferable. These solvents may be used either individually or in combination.

<Additive (F)>

The radiation-sensitive resin composition may optionally include an uneven distribution promoter, a surfactant, an alicyclic compound, a sensitizer, a crosslinking agent, and the like as the additive (F).

(Uneven Distribution Promoter)

The uneven distribution promoter causes the polymer (A) to be more efficiently unevenly distributed over the surface of the resist film. The amount of the polymer (A) used to produce the radiation-sensitive resin composition can be reduced by adding the uneven distribution promoter to the radiation-sensitive resin composition. This makes it possible to further suppress elution of components from the resist film to an immersion liquid without impairing the basic resist performance (e.g., LWR, development defect resistance, and pattern collapse resistance), or implement high-speed liquid immersion lithography via a high-speed scan. It is also possible to suppress defects (e.g., watermark defects) that may occur due to liquid immersion lithography. Examples of the uneven distribution promoter include a low-molecular-weight compound having a relative dielectric constant of 30 to 200 and a boiling point at 1 atmosphere of 100° C. or more. Examples of such a compound include lactone compounds, carbonate compounds, nitrile compounds, polyhydric alcohols, and the like.

Specific examples of the lactone compounds include γ-butyrolactone, valerolactone, mevalonic lactone, norbornane lactone, and the like.

Specific examples of the carbonate compounds include propylene carbonate, ethylene carbonate, butylene carbonate, vinylene carbonate, and the like.

Specific examples of the nitrile compounds include succinonitrile and the like. Specific examples of the polyhydric alcohols include glycerol and the like.

The uneven distribution promoter is used in an amount of 10 to 500 parts by mass based on 100 parts by mass of the polymers included in the radiation-sensitive resin composition. The radiation-sensitive resin composition may include only one type of uneven distribution promoter, or may include two or more types of uneven distribution promoter.

(Surfactant)

The surfactant improves the applicability, the developability, and the like of the radiation-sensitive resin composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonylphenyl ether, polyethylene glycol dilaurate, and polyethylene glycol distearate, commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination. The surfactant is normally used in an amount of 2 parts by mass or less based on 100 parts by mass of the polymers included in the radiation-sensitive resin composition.

(Alicyclic Skeleton-Containing Compound)

The alicyclic skeleton-containing compound improves the dry etching resistance, the pattern shape, adhesion to a substrate, and the like. Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$.1$^{7,10}$]dodecane; 2-hydroxy-9-methoxycarbonyl-5-oxo-4-oxa-tricyclo[4.2.1.0$^{3,7}$] nonane; and the like. These alicyclic skeleton-containing compounds may be used either individually or in combination. The alicyclic skeleton-containing compound is normally used in an amount of 50 parts by mass or less, and preferably 30 parts by mass or less, based on 100 parts by mass of the polymers included in the radiation-sensitive resin composition.

(Sensitizer)

The sensitizer absorbs energy other than the energy of radiation absorbed by the acid generator (C), and transmits the energy to the acid generator (C) as radicals or the like so that the amount of acid generated increases. The sensitizer thus improves the apparent sensitivity of the radiation-sensitive resin composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

(Crosslinking Agent)

When using the radiation-sensitive resin composition as a negative-tone radiation-sensitive resin composition, the radiation-sensitive resin composition may include a compound that crosslinks an alkaline developer-soluble polymer in the presence of an acid (hereinafter referred to as "crosslinking agent"). Examples of the crosslinking agent include a compound that includes at least one functional group (hereinafter referred to as "crosslinkable functional group") that exhibits crosslinking reactivity with an alkaline developer-soluble polymer.

Examples of the crosslinkable functional group include a glycidyl ether group, a glycidyl ester group, a glycidyl amino group, a methoxymethyl group, an ethoxymethyl group, a benzyloxymethyl group, an acetoxymethyl group, a benzoiloxymethyl group, a formyl group, an acetyl group, a vinyl group, an isopropenyl group, a (dimethylamino)methyl group, a (diethylamino)methyl group, a (dimethylolamino) methyl group, a (diethylolamino)methyl group, a morpholinomethyl group, and the like.

Examples of the crosslinking agent include the crosslinking agents disclosed in paragraphs [0169] to [0172] of WO2009/51088.

A methoxymethyl group-containing compound (e.g., dimethoxymethylurea or tetramethoxy methyl glycoluril) is particularly preferable as the crosslinking agent. The negative-tone radiation-sensitive resin composition may include only one type of crosslinking agent, or may include two or more types of crosslinking agent.

The crosslinking agent is preferably used in an amount of 5 to 95 parts by mass, more preferably 15 to 85 parts by mass, and particularly preferably 20 to 75 parts by mass, based on 100 parts by mass of the alkaline developer-soluble polymer. If the amount of the crosslinking agent is less than 5 parts by mass, the residual ratio may decrease, or the resulting pattern may be curved or may swell, for example. If the amount of the crosslinking agent exceeds 95 parts by mass, the alkali developability of the composition may deteriorate.

A dye, a pigment, an adhesion improver, and the like may also be used as the additive (F). For example, the dye or pigment visualizes the latent image in the exposed area, and reduces the effect of halation during exposure. The adhesion improver improves adhesion to a substrate. Examples of other additives include an alkali-soluble resin, a low-molecularweight alkali-solubility controller that includes an acid-labile protecting group, a halation inhibitor, a preservation stabilizer, an anti-foaming agent, and the like.

These additives (F) may be used either individually or in combination.

<Preparation of Radiation-Sensitive Resin Composition Solution>

The radiation-sensitive resin composition is normally prepared as a composition solution by dissolving the components in the solvent so that the total solid content is 1 to 50 mass %, and preferably 1 to 25 mass %, and filtering the solution through a filter having a pore size of about 0.2 μm, for example.

It is preferable that the radiation-sensitive resin composition have an impurity (e.g., halogen ions and metals) content as low as possible. The sensitivity, the resolution, the process stability, the pattern shape, and the like of the resist film can be further improved by reducing the impurity content. Therefore, the polymers (A) and (B) used to produce the radiation-sensitive resin composition are preferably purified by chemical purification (e.g., washing with water, liquid-liquid extraction, or metal removal filtration), or a combination of chemical purification and physical purification (e.g., ultrafiltration or centrifugation).

<Photoresist Pattern-Forming Method>

A resist pattern-forming method according to the invention includes (1) forming a photoresist film on a substrate using the radiation-sensitive resin composition (hereinafter may be referred to as "step (1)"), (2) subjecting the photoresist film to liquid immersion lithography via an immersion liquid provided over the photoresist film (hereinafter may be referred to as "step (2)"), and (3) developing the photoresist film subjected to liquid immersion lithography to form a resist pattern (hereinafter may be referred to as "step (3)"). A resist pattern having an excellent pattern shape can be formed by the resist pattern-forming method.

In the step (1), a photoresist film is formed by applying a solution of the radiation-sensitive composition (radiation-sensitive resin composition solution) to a substrate (e.g., silicon wafer or aluminum-coated wafer) by an appropriate coating method (e.g., rotational coating, cast coating, or roll coating). Specifically, the radiation-sensitive resin composition solution is applied so that the resulting resist film has a given thickness, and prebaked (PB) to volatilize the solvent from the film. A resist film is thus formed.

The thickness of the resist film is not particularly limited, but is preferably 10 to 5000 nm, and more preferably 10 to 2000 nm.

The prebaking temperature is determined depending on the composition of the radiation-sensitive resin composition, but is preferably about 30 to about 200° C., and more preferably 50 to 150° C.

In the step (2), radiation is applied to the photoresist film formed by the step (1) via an immersion liquid provided over the photoresist film (i.e., the photoresist film is subjected to liquid immersion lithography).

Purified water, a long-chain or cyclic aliphatic compound, or the like may be used as the immersion liquid.

Visible rays, ultraviolet rays, deep ultraviolet rays, X-rays, electron beams, or the like may be appropriately used as the radiation depending on the type of acid generator (C). It is preferable to use deep ultraviolet rays such as ArF excimer laser light (wavelength: 193 nm) or KrF excimer laser light (wavelength: 248 nm). It is particularly preferable to use ArF excimer laser light (wavelength: 193 nm).

The exposure conditions (e.g., dose) may be appropriately selected depending on the composition of the radiation-sensitive resin composition, the type of additive, and the like.

The photoresist film is normally subjected to post-exposure bake (PEB) after exposure. The acid-labile group included in the resin component undergoes a deprotection reaction smoothly due to PEB. The PEB temperature may be appropriately adjusted depending on the composition of the radiation-sensitive resin composition, but is normally 30 to 200° C., and preferably 50 to 150° C.

In order to maximize the performance of the radiation-sensitive resin composition, an organic or inorganic antireflective film may be formed on the substrate, as disclosed in Japanese Examined Patent Publication (KOKOKU) No. 6-12452 (Japanese Patent Application Publication (KOKAI) No. 59-93448), for example. A protective film may be formed on the photoresist film (see Japanese Patent Application Publication (KOKAI) No. 5-188598, for example) in order to prevent an adverse effect of basic impurities and the like contained in the environmental atmosphere. These techniques may be used in combination.

In the step (3), the resist film subjected to liquid immersion lithography (i.e., exposed resist film) is developed to form a given resist pattern.

It is preferable to use an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water as a developer used for development.

The concentration of the alkaline aqueous solution is preferably 10 mass % or less. If the concentration of the alkaline aqueous solution exceeds 10 mass %, the unexposed area may be dissolved in the developer.

An organic solvent may be added to the alkaline aqueous solution (developer). Examples of the organic solvent include ketones such as acetone, methyl ethyl ketone, methyl i-butyl ketone, cyclopentanone, cyclohexanone, 3-methylcyclopentanone, and 2,6-dimethylcyclohexanone, alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol, ethers such as tetrahydrofuran and dioxane, esters such as ethyl acetate, n-butyl acetate, and i-amyl acetate, aromatic hydrocarbons such as toluene and xylene, phenol, acetonylacetone, dimethylformamide, and the like. These organic solvents may be used either individually or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability.

An appropriate amount of a surfactant or the like may also be added to the alkaline aqueous solution (developer).

After developing the resist film using the alkaline aqueous solution (developer), the resist film is normally rinsed with water, and dried.

<Resist Film>

A resist film according to the invention is formed using the radiation-sensitive resin composition according to the invention. The radiation-sensitive resin composition includes the polymer (A) that includes the repeating unit (a1) and a fluorine atom. Since the polymer (A) includes a large number (amount) of fluorine atom-containing repeating units as compared with the polymer (B), the polymer (A) is easily unevenly distributed in the surface layer of the resist film formed on a substrate. Therefore, the surface of the resist film shows a high contact angle with a water droplet. For example, the surface of the resist film has a receding contact angle (i.e., contact angle (dynamic contact angle)) with a water droplet of 70° or more when the resist film is tilted. The term "receding contact angle" used herein refers to the contact angle of a water droplet with the resist film at the rear endpoint in the moving direction of the water droplet. The receding contact angle increases as the hydrophobicity of the surface of the resist film increases.

In particular, the number of defects is reduced, and a small LWR and excellent MEF are obtained when forming a pattern using the resist film. Therefore, the radiation-sensitive resin composition according to the invention may suitably be used to form a resist film.

Note that the concentration of the acid generator (C) and the acid diffusion controller (D) may differ between the base and the surface layer (i.e., a layer that has a high fluorine atom-containing polymer content) of the resist film. For example, the concentration of an acid that causes the acid-labile group to dissociate (to be eliminated) may decrease in the surface layer in the exposed area. However, the polymer (A) that includes the repeating unit (a1) that includes the group shown by the formula (1) or (2) exhibits high elimination (dissociation) reactivity with an acid. Therefore, the surface layer of the resist film formed using the radiation-sensitive resin composition exhibits high solubility in a developer in the exposed area, and the lithographic performance (e.g., resolution, LWR, and MEF) of the resist can be optimized while suppressing occurrence of defects.

EXAMPLES

The invention is further described below by way of examples. Note that the invention is not limited to the following examples. In the examples, synthesis examples, and comparative examples, the unit "parts" refers to "parts by mol", and the unit "%" refers to "mol %", unless otherwise specified. The property values were measured by the following methods.

[Polystyrene-Reduced Weight Average Molecular Weight (Mw)]

The polystyrene-reduced weight average molecular weight (Mn) was measured by gel permeation chromatography (GPC) using GPC columns manufactured by Tosoh Corporation (G2000HXL×2, G3000HXL×1, G4000HXL×1) at a flow rate of 1.0 ml/min and a column temperature of 40° C. (eluant: tetrahydrofuran, standard: monodisperse polystyrene).

[Polystyrene-Reduced Number Average Molecular Weight (Mn)]

The polystyrene-reduced number average molecular weight (Mn) was measured by gel permeation chromatography (GPC) using GPC columns manufactured by Tosoh Corporation (G2000HXL×2, G3000HXL×1, G4000HXL×1) at a flow rate of 1.0 ml/min and a column temperature of 40° C. (eluant: tetrahydrofuran, standard: monodisperse polystyrene).

[$^1$H-NMR Analysis and $^{13}$C-NMR Analysis]

The NMR analysis was performed using a nuclear magnetic resonance spectrometer ("JNM-ECX400" manufactured by JEOL Ltd.).

[Measurement of Receding Contact Angle]

A film was formed on a substrate (wafer) using the radiation-sensitive resin composition. The receding contact angle of the film was measured by the following method at a temperature of 23° C. (room temperature) and a humidity of 45% under atmospheric pressure using a contact angle meter "DSA-10" (manufactured by KRUS). An 8-inch silicon wafer was used as the substrate. The thickness of the film was 75 nm. The receding contact angle was measured after soft-baking (SB) the film at 120° C. for 60 seconds.

Specifically, the position of the wafer stage of the contact angle meter was adjusted, and the wafer was placed on the stage. After injecting water into the needle of the contact angle meter, the position of the needle was finely adjusted to an initial position. Water was then discharged from the needle to form a water droplet (25 µl) on the wafer, and the needle was withdrawn from the water droplet. The needle was then moved downward to the initial position. The water droplet was sucked via the needle for 90 seconds at a rate of 10 µl/min, and the contact angle was measured every second (90 times in total). The average value of twenty contact angles measured after the value became stable was calculated, and taken as the receding contact angle (°).

[Measurement of Number of Defects]

A defect inspection wafer was prepared as described below. A film (thickness: 75 nm) of the radiation-sensitive resin composition was formed on a 12-inch silicon wafer on which an underlayer antireflective film ("ARC66" manufactured by Nissan Chemical Industries, Ltd.) was formed. The film was soft-baked (SB) at 120° C. for 60 seconds. The film was exposed via a mask (line-and-space pattern (1L/1S), line width target size: 45 nm) using an ArF immersion scanner ("NSR S610C" manufactured by Nikon Corporation) (NA=1.3, iNA=1.27, ratio=0.750, Dipole).

The film was then subjected to post-exposure bake (PEB) at 85° C. for 60 seconds. The exposed film was developed using a 2.38 mass % tetramethylammonium hydroxide aqueous solution, rinsed with water, and dried to form a positive-tone resist pattern. A dose at which a line-and-space pattern having a width of 45 nm was formed was determined to be an optimum dose. A line-and-space pattern having a width of 45 nm was formed over the entire wafer at the optimum dose to obtain a defect inspection wafer. A scanning electron microscope ("CC-4000" manufactured by Hitachi High-Technologies Corporation) was used for the measurement.

The number of defects on the defect inspection wafer was measured using a system "KLA2810" (manufactured by KLA-Tencor). The number of defects (repeater defects) detected at the same position within each shot (i.e., defects due to the mask) was subtracted from the total number of defects measured using the system "KLA2810", and the resulting value was evaluated as the number of defects.

[Measurement of Line Width Roughness (LWR)]

A 45 nm line-and-space pattern resolved on the defect inspection wafer at the optimum dose was observed from above using a scanning electron microscope ("CC-4000" manufactured by Hitachi High-Technologies Corporation), and the line width was measured at an arbitrary ten points. The 3σ value (variation) of the line width measured values was evaluated as the LWR (nm).

[Measurement of Mask Error Factor (MEF)]

An MEF measurement sample was prepared in the same manner as the defect inspection wafer, except that a resist pattern (pitch: 90 nm) was formed using a mask having a line width target size of 40 nm, 42 nm, 44 nm, 46 nm, 48 nm, or 50 nm (line-and-space pattern, pitch: 90 nm).

A graph was drawn by plotting the line width target size (nm) (horizontal axis) and the actual line width (nm) of the resist film formed using each mask pattern (vertical axis), and the slope of the straight line of the graph was calculated as the MEF. The MEF (i.e., the slope of the straight line) becomes closer to 1 as the mask reproducibility increases.

Synthesis of Monomer

Synthesis of Monomer (M-1)

17.2 g of 1-p-tolylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (=1/1 (volume ratio)) as an eluant to obtain the target compound (yield: 62%).

The structure of the compound was determined by $^1$H-NMR analysis. The results are shown below.

$^1$H-NMR (DMSO-$d_6$, internal standard: TMS): δ (ppm)= 1.16-1.82 (8.0H), 1.82-1.95 (3.0H), 2.31-2.31 (3.0H), 2.19-2.45 (2.0H), 5.58-6.15 (2.0H), 7.01-7.30 (4H).

It was thus confirmed that the compound had a structure shown by the following formula. The compound is hereinafter referred to as "monomer (M-1)".

[Chemical Formula 48]

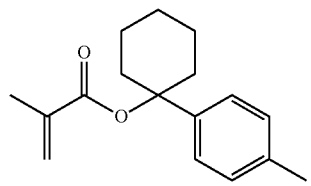

Synthesis of Monomer (M-2)

15.9 g of 1-p-tolylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (=1/1 (volume ratio)) as an eluant to obtain the target compound (yield: 54%).

The structure of the compound was determined by $^1$H-NMR analysis. The results are shown below.

$^1$H-NMR (DMSO-$d_6$, internal standard: TMS): δ (ppm)= 1.52-1.90 (7.0H), 1.90-2.10 (2.0H), 2.15-2.26 (3.0H), 2.26-2.40 (2.0H), 5.50-6.10 (2.0H), 7.00-7.31 (4.0H).

It was thus confirmed that the compound had a structure shown by the following formula. The compound is hereinafter referred to as "monomer (M-2)".

[Chemical Formula 49]

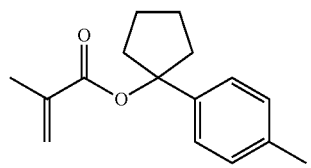

Synthesis of Monomer (M-3)

15.9 g of 1-phenylcyclohexanol, 12.2 g of methacrylic chloride, and 13.12 g of 1,4-diazabicyclo[2.2.2]octane were dissolved in 200 g of methylene chloride, and reacted for 6 hours under reflux. After completion of the reaction, ethyl acetate was added to the reaction solution, and the organic layer was washed with water. The organic layer was then purified by silica gel column chromatography using an ethyl acetate/n-hexane mixture (=1/1 (volume ratio)) as an eluant to obtain the target compound (yield: 60%).

The structure of the compound was determined by $^1$H-NMR analysis. The results are shown below.

$^1$H-NMR (DMSO-$d_6$, internal standard: TMS): δ (ppm)= 1.11-1.82 (8.0H), 1.85-1.90 (3.0H), 2.30-2.45 (2.0H), 5.58-6.10 (2.0H), 7.15-7.23 (1H), 7.23-7.35 (4.0H).

It was thus confirmed that the compound had a structure shown by the following formula. The compound is hereinafter referred to as "compound (M-3)".

[Chemical Formula 50]

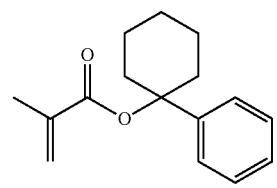

Synthesis of Polymer (A)

Polymers (A-1) to (A-9) were synthesized using the monomers (M-1), (M-2), and (M-3) and the following monomers (M-4) to (M-12).

[Chemical Formula 51]

(M-4)

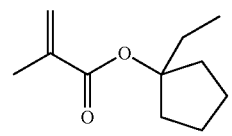

(M-5)

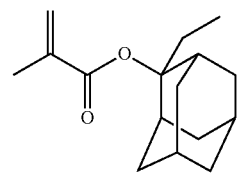

(M-6)

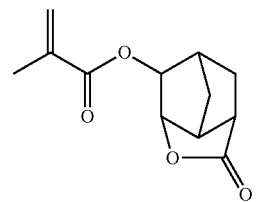

(M-7)

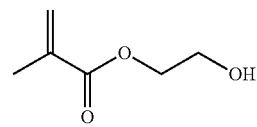

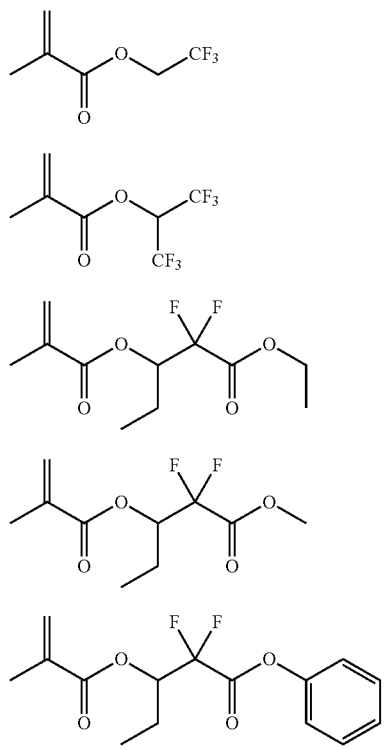

(M-4): 1-ethylcyclopentyl methacrylate
(M-5): 1-ethyladamantyl methacrylate
(M-6): 4-oxa-5-oxotricyclo[4.2.1.0$^{3,7}$]nonan-2-ylmethacrylate
(M-7): 2-hydroxyethyl methacrylate
(M-8): 2-(1,1,1-trifluoroethyl)methacrylate
(M-9): 2-(1,1,1,3,3,3-hexafluoropropyl)methacrylate
(M-10): 1-ethoxycarbonyl-1,1-difluoro-2-butyl methacrylate
(M-11): 1-methoxycarbonyl-1,1-difluoro-2-butyl methacrylate
(M-12): 1-phenoxycarbonyl-1,1-difluoro-2-butyl methacrylate Example 1

Polymer (A-1)

39.10 g (70 mol %) of the monomer (M-1) and 10.90 g (30 mol %) of the monomer (M-8) were dissolved in 50 g of 2-butanone, and 3.98 g (8 mol % based on the total amount of the monomers) of dimethyl 2,2'-azobis(2-methylpropionate) (initiator) was added to the solution to prepare a monomer solution.

A 500 ml three-necked flask equipped with a thermometer and a dropping funnel was charged with 50 g of 2-butanone, and purged with nitrogen for 30 minutes. The inside of the flask was then heated to 80° C. with stirring using a magnetic stirrer. The monomer solution was then added dropwise to the flask using the dropping funnel over 3 hours. The monomers were polymerized for 6 hours from the start of addition of the monomer solution. After completion of polymerization, the polymer solution was cooled with water to 30° C. or less. The reaction solution, 150 g of hexane, 600 g of methanol, and 30 g of water were poured into a separating funnel. The mixture was vigorously stirred, and then allowed to stand. The mixture was thus separated into two layers. After allowing the mixture to stand for 3 hours, the lower layer (resin solution) was isolated preparatively. The solvent of the resin solution was replaced with propylene glycol monomethyl ether acetate using an evaporator. 145.3 g of a propylene glycol monomethyl ether acetate solution of a copolymer was thus obtained. The solid content of the solution was determined using a hot plate. It was found that the copolymer concentration was 21.0%, and the yield was 61%. The copolymer is hereinafter referred to as "polymer (A-1)".

The polymer (A-1) had an Mw of 7200 and a dispersity (Mw/Mn) of 1.2. The ratio of the content of repeating units derived from the compound (M-1) to the content of repeating units derived from the compound (M-8) in the polymer (A-1) determined by $^{13}$C-NMR analysis was 71.5:28.5 (mol %).

Example 2

Polymer (A-2)

38.61 g (70 mol %) of the monomer (M-2) and 11.39 g (30 mol %) of the monomer (M-8) were dissolved in 50 g of 2-butanone, and 4.16 g (8 mol % based on the total amount of the monomers) of dimethyl 2,2'-azobis(2-methylpropionate) (initiator) was added to the solution to prepare a monomer solution.

150.1 g of a propylene glycol monomethyl ether acetate solution of a copolymer was obtained in the same manner as in Example 1, except that the monomer solution obtained as described above was used. The solid content of the solution was determined using a hot plate. It was found that the copolymer concentration was 20.7%, and the yield was 62%. The copolymer is hereinafter referred to as "polymer (A-2)". The polymer (A-2) had an Mw of 7300 and a dispersity (Mw/Mn) of 1.2. The ratio of the content of repeating units derived from the compound (M-2) to the content of repeating units derived from the compound (M-8) in the polymer (A-2) determined by $^{13}$C-NMR analysis was 71.8:28.2 (mol %).

Example 3

Polymer (A-3)

42.72 g (85 mol %) of the monomer (M-2) and 7.28 g (15 mol %) of the monomer (M-9) were dissolved in 50 g of 2-butanone, and 3.79 g (8 mol % based on the total amount of the monomers) of dimethyl 2,2'-azobis(2-methylpropionate) (initiator) was added to the solution to prepare a monomer solution.

155.0 g of a propylene glycol monomethyl ether acetate solution of a copolymer was obtained in the same manner as in Example 1, except that the monomer solution obtained as described above was used. The solid content of the solution was determined using a hot plate. It was found that the copolymer concentration was 19.4%, and the yield was 60%. The copolymer is hereinafter referred to as "polymer (A-3)". The polymer (A-3) had an Mw of 7500 and a dispersity (Mw/Mn) of 1.2. The ratio of the content of repeating units derived from the compound (M-2) to the content of repeating units derived from the compound (M-9) in the polymer (A-3) determined by $^{13}$C-NMR analysis was 85.5:14.5 (mol %).

Example 4

Polymer (A-4)

19.71 g (40 mol %) of the monomer (M-2) and 30.29 g (60 mol %) of the monomer (M-10) were dissolved in 50 g of 2-butanone, and 2.32 g (7 mol % based on the total amount of the monomers) of AIBN (initiator) was added to the solution to prepare a monomer solution.

A 500 ml three-necked flask equipped with a thermometer and a dropping funnel was charged with 50 g of 2-butanone, and purged with nitrogen for 30 minutes. The inside of the flask was then heated to 80° C. with stirring using a magnetic stirrer. The monomer solution was then added dropwise to the flask using the dropping funnel over 3 hours. After the addition, an initiator solution prepared by dissolving 1.16 g of AIBN in 10 g of 2-butanone was added dropwise to the mixture over 15 minutes. When 1.45 hours had elapsed after completion of addition, an initiator solution prepared by dissolving 1.16 g of AIBN in 10 g of 2-butanone was added dropwise to the mixture over 15 minutes. The monomers were further polymerized for 1.45 hours. After completion of polymerization, the polymer solution was cooled with water to 30° C. or less. After concentrating the polymer solution to 80 g using an evaporator, a mixture of 20 g of water and 380 g of methanol was poured into the polymer solution. The mixture was vigorously stirred, and then allowed to stand for 1 hour. The supernatant liquid was then removed by decantation to obtain a white solid. After the addition of a mixture of 20 g of water and 380 g of methanol, the mixture was vigorously stirred, and then allowed to stand for 1 hour. The supernatant liquid was then removed by decantation to obtain a white solid. The solvent was replaced with propylene glycol monomethyl ether acetate using an evaporator. 121.4 g of a propylene glycol monomethyl ether acetate solution of a copolymer was thus obtained. The solid content of the solution was determined using a hot plate. It was found that the copolymer concentration was 18.7%, and the yield was 46%. The copolymer is hereinafter referred to as "polymer (A-4)".

The polymer (A-4) had an Mw of 4100 and a dispersity (Mw/Mn) of 1.4. The ratio of the content of repeating units derived from the compound (M-2) to the content of repeating units derived from the compound (M-10) in the polymer (A-4) determined by $^{13}$C-NMR analysis was 40.1:59.9 (mol %).

Example 5

Polymer (A-5)

20.41 g (40 mol %) of the monomer (M-2) and 29.59 g (60 mol %) of the monomer (M-11) were dissolved in 50 g of 2-butanone, and 2.20 g (7 mol % based on the total amount of the monomers) of AIBN (initiator) was added to the solution to prepare a monomer solution.

123.4 g of a propylene glycol monomethyl ether acetate solution of a copolymer was obtained in the same manner as in Example 4, except that the monomer solution obtained as described above was used, and the amount of AIBN was changed to 1.10 g. The solid content of the solution was determined using a hot plate. It was found that the copolymer concentration was 19.4%, and the yield was 48%. The copolymer is hereinafter referred to as "polymer (A-5)". The polymer (A-5) had an Mw of 4200 and a dispersity (Mw/Mn) of 1.4. The ratio of the content of repeating units derived from the compound (M-2) to the content of repeating units derived from the compound (M-11) in the polymer (A-5) determined by $^{13}$C-NMR analysis was 40.3:59.7 (mol %).

Example 6

Polymer (A-6)

17.66 g (40 mol %) of the monomer (M-2) and 32.34 g (60 mol %) of the monomer (M-12) were dissolved in 50 g of 2-butanone, and 2.08 g (7 mol % based on the total amount of the monomers) of AIBN (initiator) was added to the solution to prepare a monomer solution.

135.1 g of a propylene glycol monomethyl ether acetate solution of a copolymer was obtained in the same manner as in Example 4, except that the amount of AIBN was changed to 1.04 g. The solid content of the solution was determined using a hot plate. It was found that the copolymer concentration was 15.9%, and the yield was 48%. The copolymer is hereinafter referred to as "polymer (A-6)". The polymer (A-6) had an Mw of 4500 and a dispersity (Mw/Mn) of 1.3. The ratio of the content of repeating units derived from the compound (M-2) to the content of repeating units derived from the compound (M-12) in the polymer (A-6) determined by $^{13}$C-NMR analysis was 41.6: 58.4 (mol %).

Example 7

Polymer (A-7)

38.61 g (70 mol %) of the monomer (M-3) and 11.39 g (30 mol %) of the monomer (M-8) were dissolved in 50 g of 2-butanone, and 4.16 g (8 mol % based on the total amount of the monomers) of dimethyl 2,2'-azobis(2-methylpropionate) (initiator) was added to the solution to prepare a monomer solution.

155.3 g of a propylene glycol monomethyl ether acetate solution of a copolymer was obtained in the same manner as in Example 1, except that the monomer solution obtained as described above was used. The solid content of the solution was determined using a hot plate. It was found that the copolymer concentration was 20.0%, and the yield was 62%. The copolymer is hereinafter referred to as "polymer (A-7)". The polymer (A-7) had an Mw of 7100 and a dispersity (Mw/Mn) of 1.2. The ratio of the content of repeating units derived from the compound (M-3) to the content of repeating units derived from the compound (M-8) in the polymer (A-7) determined by $^{13}$C-NMR analysis was 70.7:29.3 (mol %).

Example 8

Polymer (A-8)

5.15 g (10 mol %) of the monomer (M-2) and 44.85 g (90 mol %) of the monomer (M-11) were dissolved in 50 g of 2-butanone, and 2.42 g (7 mol % based on the total amount of the monomers) of AIBN (initiator) was added to the solution to prepare a monomer solution.

126.4 g of a propylene glycol monomethyl ether acetate solution of a copolymer was obtained in the same manner as in Example 4, except that the amount of AIBN was changed to 1.10 g. The solid content of the solution was determined using a hot plate. It was found that the copolymer concentration was 15.8%, and the yield was 40%. The copolymer is hereinafter referred to as "polymer (A-8)". The polymer (A-8) had an Mw of 4300 and a dispersity (Mw/Mn) of 1.4. The ratio of the content of repeating units derived from the compound (M-2) to the content of repeating units derived from the compound (M-11) in the polymer (A-8) determined by $^{13}$C-NMR analysis was 10.2:89.8 (mol %).

Example 9

Polymer (A-9)

45.15 g (90 mol %) of the monomer (M-2) and 4.85 g (10 mol %) of the monomer (M-11) were dissolved in 50 g of 2-butanone, and 2.36 g (7 mol % based on the total amount of the monomers) of AIBN (initiator) was added to the solution to prepare a monomer solution.

131.2 g of a propylene glycol monomethyl ether acetate solution of a copolymer was obtained in the same manner as in Example 4, except that the amount of AIBN was changed to 1.10 g. The solid content of the solution was determined using a hot plate. It was found that the copolymer concentration was 21.3%, and the yield was 56%. The copolymer is hereinafter referred to as "polymer (A-9)". The polymer (A-9) had an Mw of 5200 and a dispersity (Mw/Mn) of 1.4. The ratio of the content of repeating units derived from the compound (M-2) to the content of repeating units derived from the compound (M-11) in the polymer (A-9) determined by $^{13}$C-NMR analysis was 90.6:9.4 (mol %).

Synthesis Example 1

Polymer (A-10)

35.83 g (70 mol %) of the monomer (M-4) and 14.17 g (30 mol %) of the monomer (M-8) were dissolved in 50 g of 2-butanone, and 5.17 g (8 mol % based on the total amount of the monomers) of dimethyl 2,2'-azobis(2-methylpropionate) (initiator) was added to the solution to prepare a monomer solution.

159.2 g of a propylene glycol monomethyl ether acetate solution of a copolymer was obtained in the same manner as in Example 1, except that the monomer solution obtained as described above was used. The solid content of the solution was determined using a hot plate. It was found that the copolymer concentration was 20.1%, and the yield was 64%. The copolymer is hereinafter referred to as "polymer (A-10)". The polymer (A-10) had an Mw of 6900 and a dispersity (Mw/Mn) of 1.3. The ratio of the content of repeating units derived from the compound (M-4) to the content of repeating units derived from the compound (M-8) in the polymer (A-10) determined by $^{13}$C-NMR analysis was 70.5:29.5 (mol %).

Synthesis of Polymer (B)

Synthesis Example 2

Polymer (B-1)

13.42 g (30 mol %) of the monomer (M-4), 27.28 g (50 mol %) of the monomer (M-6), and 3.20 g (10 mol %) of the monomer (M-7) were dissolved in 100 g of 2-butanone, and 4.03 g (10 mol % based on the total amount of the monomers) of AIBN (initiator) was added to the solution to prepare a monomer solution.

A 500 ml three-necked flask equipped with a thermometer and a dropping funnel was charged with 50 g of 2-butanone and 6.10 g (10 mol %) of the monomer (M-5), and purged with nitrogen for 30 minutes. The inside of the flask was then heated to 80° C. with stirring using a magnetic stirrer. The monomer solution was then added dropwise to the flask using the dropping funnel over 3 hours. The monomers were polymerized for 6 hours from the start of addition of the monomer solution. After completion of polymerization, the polymer solution was cooled with water to 30° C. or less. The polymer solution was then added to a mixture of 800 g of methanol and 200 g of water, and a white powder that precipitated by this operation was collected by filtration. The white powder thus collected was washed twice with 200 g of methanol in a slurry state. The white powder was again collected by filtration, and dried at 60° C. for 17 hours to obtain a white powdery copolymer (34.2 g, yield: 68%). The copolymer is hereinafter referred to as "polymer (B-1)".

The polymer (B-1) had an Mw of 4300 and a dispersity (Mw/Mn) of 1.3. The ratio of the content of repeating units derived from the compound (M-4), the content of repeating units derived from the compound (M-5), the content of repeating units derived from the compound (M-6), and the content of repeating units derived from the compound (M-7) in the polymer (B-1) determined by $^{13}$C-NMR analysis was 29.0:8.0:52.9:10.1 (mol %).

The type and the amount of each monomer used to produce the polymers (A-1) to (A-10) and (B-1), the property values of the polymers (A-1) to (A-10) and (B-1), and the like are summarized in Table 1.

TABLE 1

|  |  | Compound | | Structural unit |  |  |
|---|---|---|---|---|---|---|
|  | Polymer | Type | Amount (mol %) | Content (mol %) | Mw | Mw/Mn |
| Example 1 | (A-1) | (M-1) | 70 | 71.5 | 7200 | 1.2 |
|  |  | (M-8) | 30 | 28.5 |  |  |
| Example 2 | (A-2) | (M-2) | 70 | 71.8 | 7300 | 1.2 |
|  |  | (M-8) | 30 | 28.2 |  |  |
| Example 3 | (A-3) | (M-2) | 85 | 85.5 | 7500 | 1.2 |
|  |  | (M-9) | 15 | 14.5 |  |  |
| Example 4 | (A-4) | (M-2) | 40 | 40.1 | 4100 | 1.4 |
|  |  | (M-10) | 60 | 59.9 |  |  |
| Example 5 | (A-5) | (M-2) | 40 | 40.3 | 4200 | 1.4 |
|  |  | (M-11) | 60 | 59.7 |  |  |
| Example 6 | (A-6) | (M-2) | 40 | 41.6 | 4500 | 1.3 |
|  |  | (M-12) | 60 | 58.4 |  |  |
| Example 7 | (A-7) | (M-3) | 70 | 70.7 | 7100 | 1.2 |
|  |  | (M-8) | 30 | 29.3 |  |  |
| Example 8 | (A-8) | (M-2) | 10 | 10.2 | 4300 | 1.4 |
|  |  | (M-11) | 90 | 89.8 |  |  |
| Example 9 | (A-9) | (M-2) | 90 | 90.6 | 5200 | 1.4 |
|  |  | (M-11) | 10 | 9.4 |  |  |
| Synthesis Example 1 | (A-10) | (M-4) | 70 | 70.5 | 6900 | 1.3 |
|  |  | (M-8) | 30 | 29.5 |  |  |
| Synthesis Example 2 | (B-1) | (M-4) | 30 | 29.0 | 4300 | 1.3 |
|  |  | (M-5) | 10 | 8.0 |  |  |
|  |  | (M-6) | 50 | 52.9 |  |  |
|  |  | (M-7) | 10 | 10.1 |  |  |

[Preparation of Radiation-Sensitive Resin Composition]

Each component (acid generator (C), acid diffusion controller (D), and solvent (E)) of a radiation-sensitive resist composition other than the polymers (A-1) to (A-10) and (B-1) synthesized in the examples and the synthesis examples is shown below.

<Acid Generator (C)>
(C-1): compound shown by the following formula

[Chemical Formula 52]

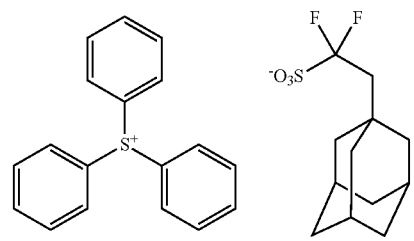

<Acid Diffusion Controller (D)>
(D-1): triphenylsulfonium salicylate
<Solvent (E)>
(E-1): propylene glycol monomethyl ether acetate
(E-2): cyclohexanone
(E-3): γ-butyrolactone

Example 10

100 parts by mass of the polymer (B-1) obtained in Synthesis Example 2, 5 parts by mass of the polymer (A-1) obtained in Example 1, 12 parts by mass of the acid generator (C-1), and 6.2 parts by mass of the acid diffusion controller (D-1) were mixed. The mixture was dissolved in 2900 parts by mass of the solvent (E-1) (propylene glycol monomethyl ether acetate), 1250 parts by mass of the solvent (E-2) (cyclohexanone), and 100 parts by mass of the solvent (E-3) (γ-butyrolactone) to obtain a mixed solution. The mixed solution was filtered through a filter having a pore size of 0.20 μm to prepare a radiation-sensitive resin composition. The radiation-sensitive resin composition is hereinafter referred to as "composition (J-1)". The content of repeating units derived from the monomer (M-1) and the content of repeating units derived from the monomer (M-8) in the composition (J-1) were respectively 3.4 mol % and 1.4 mol % based on the total amount of the polymers.

Examples 11 to 20 and Comparative Examples 1 to 3

Compositions (J-2) to (J-11) and (H-1) to (H-3) were prepared in the same manner as in Example 10, except that the type and the amount of the polymer (A) were changed. The compositions of the compositions (J-1) to (J-10) and (H-1) to (H-3) are summarized in Table 2. Note that the item "Content based on total amount of polymers (mol %)" in Table 2 indicate the content of the repeating unit (a1) and the content of the repeating unit (f) based on the total repeating units included in the polymer component included in the composition.

[Evaluation of Lithographic Performance]

The receding contact angle, the sensitivity, the number of defects, the LWR, and the MEF were evaluated using the compositions (J-1) to (J-11) of Examples 10 to 20 and the compositions (H-1) to (H-3) of Comparative Examples 1 to 3. The evaluation results are shown in Table 3.

TABLE 3

|  | Receding contact angle (°) | Sensitivity (mj/cm$^2$) | Number of defects | LWR (nm) | MEF |
|---|---|---|---|---|---|
| Example 10 | 79 | 39 | 1012 | 5.4 | 3.0 |
| Example 11 | 80 | 39 | 876 | 5.5 | 3.0 |
| Example 12 | 80 | 38 | 953 | 5.4 | 3.0 |
| Example 13 | 77 | 38 | 609 | 5.2 | 3.0 |
| Example 14 | 77 | 38 | 512 | 5.1 | 3.0 |
| Example 15 | 77 | 38 | 498 | 5.1 | 3.0 |
| Example 16 | 78 | 39 | 1536 | 5.6 | 3.0 |
| Example 17 | 79 | 39 | 1098 | 5.6 | 3.0 |
| Example 18 | 77 | 37 | 1036 | 5.1 | 3.0 |
| Example 19 | 80 | 39 | 1426 | 5.7 | 3.0 |
| Example 20 | 77 | 36 | 1012 | 5.1 | 3.0 |
| Comparative Example 1 | 79 | 40 | 24537 | 6.1 | 3.0 |
| Comparative Example 2 | 80 | 40 | >125000 | 7.5 | 3.0 |
| Comparative Example 3 | 77 | 35 | >125000 | 8.6 | 3.4 |

As shown in Table 3, the compositions of Examples 10 to 20 and Comparative Examples 1 to 3 showed a high receding contact angle of 77 to 80°. It was thus confirmed that the resist films of Examples 10 to 20 will exhibit sufficiently high

TABLE 2

| | Composition | Polymer (A) Type | Parts by mass | Amount (wt %) based on total amount of polymers | Content (mol %) based on total amount of polymers | Polymer (B) Type | Parts by mass | Acid generator (C) Type | Parts by mass | Acid diffusion controller (D) Type | Parts by mass |
|---|---|---|---|---|---|---|---|---|---|---|---|
| Example 10 | (J-1) | (A-1) | 5.0 | 4.8 | (M-1) 3.4 (M-8) 1.4 | (B-1) | 100.0 | (C-1) | 12.0 | (D-1) | 6.2 |
| Example 11 | (J-2) | (A-2) | 5.0 | 4.8 | (M-2) 3.4 (M-8) 1.3 | (B-1) | 100.0 | (C-1) | 12.0 | (D-1) | 6.2 |
| Example 12 | (J-3) | (A-3) | 5.0 | 4.8 | (M-2) 4.1 (M-9) 0.7 | (B-1) | 100.0 | (C-1) | 12.0 | (D-1) | 6.2 |
| Example 13 | (J-4) | (A-4) | 5.0 | 4.8 | (M-2) 1.9 (M-10) 2.9 | (B-1) | 100.0 | (C-1) | 12.0 | (D-1) | 6.2 |
| Example 14 | (J-5) | (A-5) | 5.0 | 4.8 | (M-2) 1.9 (M-11) 2.8 | (B-1) | 100.0 | (C-1) | 12.0 | (D-1) | 6.2 |
| Example 15 | (J-6) | (A-6) | 5.0 | 4.8 | (M-2) 2.0 (M-12) 2.8 | (B-1) | 100.0 | (C-1) | 12.0 | (D-1) | 6.2 |
| Example 16 | (J-7) | (A-7) | 5.0 | 4.8 | (M-3) 3.4 (M-8) 1.4 | (B-1) | 100.0 | (C-1) | 12.0 | (D-1) | 6.2 |
| Example 17 | (J-8) | (A-8) | 5.0 | 4.8 | (M-2) 0.5 (M-11) 4.3 | (B-1) | 100.0 | (C-1) | 12.0 | (D-1) | 6.2 |
| Example 18 | (J-9) | (A-9) | 5.0 | 4.8 | (M-2) 4.3 (M-11) 0.4 | (B-1) | 100.0 | (C-1) | 12.0 | (D-1) | 6.2 |
| Example 19 | (J-10) | (A-8) | 18.0 | 15.3 | (M-2) 1.6 (M-11) 13.7 | (B-1) | 100.0 | (C-1) | 12.0 | (D-1) | 6.2 |
| Example 20 | (J-11) | (A-9) | 18.0 | 15.3 | (M-2) 13.8 (M-11) 1.4 | (B-1) | 100.0 | (C-1) | 12.0 | (D-1) | 6.2 |
| Comparative Example 1 | (H-1) | (A-10) | 5.0 | 4.8 | (M-4) 3.4 (M-8) 1.4 | (B-1) | 100.0 | (C-1) | 12.0 | (D-1) | 6.2 |
| Comparative Example 2 | (H-2) | (A-8) | 25.0 | 20.0 | (M-2) 2.0 (M-11) 18.0 | (B-1) | 100.0 | (C-1) | 12.0 | (D-1) | 6.2 |
| Comparative Example 3 | (H-3) | (A-9) | 25.0 | 20.0 | (M-2) 18.1 (M-11) 1.9 | (B-1) | 100.0 | (C-1) | 12.0 | (D-1) | 6.2 | hydrophobicity during liquid immersion lithography. The compositions of Examples 10 to 20 also exhibited high sensitivity.

In Comparative Example 1, about 24,500 defects were observed on the defect inspection wafer. In Comparative Examples 2 and 3, the number of defects exceeded the measurement upper limit value. In Comparative Examples 1 and 2, the number of defects in which two lines were partially connected was large. In Comparative Example 3, the top of the line pattern was significantly rounded, and a residue was observed in the space pattern (i.e., the resolution was low).

In Examples 10 to 20, the number of defects was smaller than those of Comparative Examples 1 to 3 (i.e., the number of defects was equal to or less than 1/10 of that of Comparative Example 1 in which the number of defects was a minimum among Comparative Examples 1 to 3). In particular, the number of defects was very small in Examples 13 to 15 as compared with Comparative Example 1 (i.e., the number of defects was two orders of magnitude less than that of Comparative Example 1). A rectangular line-and-space pattern was obtained in Examples 10 to 20.

In Examples 10 to 20, the LWR was smaller than those (6.1 to 8.6 nm) of Comparative Example 1 to 3. It was thus confirmed that a variation in line width of the resist pattern was small (i.e., excellent linearity was achieved) in Examples 10 to 20. The MEF was also sufficiently small (3.0) (i.e., high sensitivity was achieved) in Examples 10 to 20.

Obviously numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a polymer component including a polymer (A) and a polymer (B);
the polymer (A) having a repeating unit (a1) and a fluorine atom, the repeating unit (a1) having a group shown by a formula (1) or (2); and
the polymer (B) being other than the polymer (A), being a base polymer of the polymer component and having an acid-dissociable group,
wherein an amount of the polymer (A) is 0.1 mass % or more and less than 20 mass % based on a total amount of the polymer component,

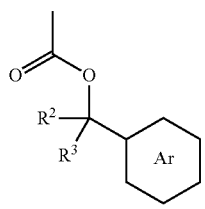

(1)

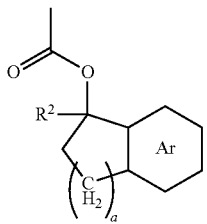

(2)

wherein the following formula represents a substituted or unsubstituted aromatic hydrocarbon group,

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with a carbon atom bonded to $R^2$ and $R^3$, and a is 1 or 2.

2. The radiation-sensitive resin composition according to claim 1, wherein the repeating unit (a1) is a repeating unit shown by a formula (3) or (4),

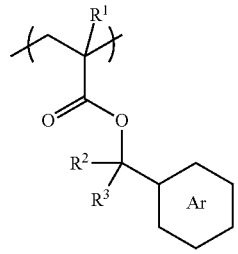

(3)

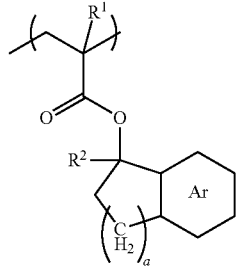

(4)

wherein the following formula represents a substituted or unsubstituted aromatic hydrocarbon group,

$R^2$ represents a hydrogen atom, a linear, branched, or cyclic alkyl group having 1 to 12 carbon atoms, or an aromatic hydrocarbon group, $R^3$ represents a linear, branched, or cyclic alkyl group having 1 to 12 carbon atoms, provided that $R^2$ and $R^3$ may form a divalent alicyclic hydrocarbon group having 5 to 12 carbon atoms together with a carbon atom bonded to $R^2$ and $R^3$, a is 1 or 2, and $R^1$ represents a hydrogen atom, a fluorine atom, or a monovalent chain-like hydrocarbon group that may be substituted with a fluorine atom.

3. The radiation-sensitive resin composition according to claim 1, wherein the polymer (A) includes a repeating unit (f) that includes a fluorine atom, wherein the repeating unit (f) excludes a repeating unit that falls under the repeating unit (a1).

4. The radiation-sensitive resin composition according to claim 3, wherein the repeating unit (f) reacts with a developer to produce a polar group.

5. The radiation-sensitive resin composition according to claim 4, wherein the polar group is a carboxyl group.

6. The radiation-sensitive resin composition according to claim 1, wherein the amount of the polymer (A) is 1 mass % or more and less than 17 mass % based on a total amount of the polymer component.

7. The radiation-sensitive resin composition according to claim 1, wherein $R^2$ and $R^3$ form a divalent alicyclic hydrocarbon together with a carbon atom bonded to $R^2$ and $R^3$.

8. The radiation-sensitive resin composition according to claim 1, wherein the polymer (B) does not include the repeating unit (a1).

9. The radiation-sensitive resin composition according to claim 1, wherein the polymer (B) does not include a fluorine atom, or the polymer (B) has a fluorine atom and a content of the fluorine atom included in the polymer (B) is lower than a content of a fluorine atom included in the polymer (A).

10. The radiation-sensitive resin composition according to claim 1, wherein the polymer (B) does not include a fluorine atom.

11. The radiation-sensitive resin composition according to claim 1, wherein the polymer (B) does not include the repeating unit (a1) and does not include a fluorine atom.

12. The radiation-sensitive resin composition according to claim 1, wherein the polymer (B) includes a repeating unit having a cycloalkane skeleton.

13. The radiation-sensitive resin composition according to claim 3, wherein a content of the repeating unit (f) in the polymer (A) is from 28 mol % to 95 mol % based on a total amount of repeating units included in the polymer (A).

14. The radiation-sensitive resin composition according to claim 2, wherein the polymer (A) further includes a repeating unit represented by a formula (f-2),

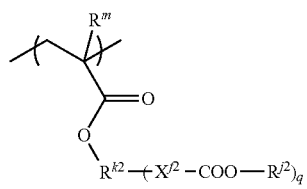

(f-2)

wherein $R^m$ represents a hydrogen atom, a fluorine atom, or a monovalent chain hydrocarbon group that is unsubstituted or substituted with a fluorine atom, $R^{k2}$ represents a (q+1)-valent linking group, $X^{f2}$ represents a divalent linking group that includes at least one fluorine atom, $R^{f2}$ represents a hydrogen atom or a monovalent organic group, and q is an integer from 1 to 3, wherein in a case where q is 2 or 3, each of a plurality of $X^{fn}$ is identical or different to each other, and each of a plurality of $R^{f2}$ is identical or different to each other.

15. The radiation-sensitive resin composition according to claim 2, wherein the polymer (A) further includes a repeating unit represented by a formula (f-1),

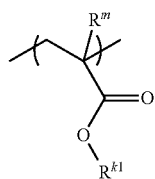

(f-1)

wherein $R^m$ represents a hydrogen atom, a fluorine atom, or a monovalent chain hydrocarbon group that is unsubstituted or substituted with a fluorine atom, and $R^{f1}$ represents a monovalent chain hydrocarbon group that is substituted with a fluorine atom, or a monovalent alicyclic hydrocarbon group that is substituted with a fluorine atom.

16. The radiation-sensitive resin composition according to claim 2, wherein the polymer (A) further includes a repeating unit represented by a formula (f-3),

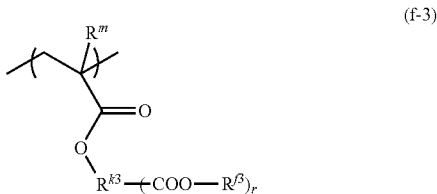

(f-3)

wherein $R^m$ represents a hydrogen atom, a fluorine atom, or a monovalent chain hydrocarbon group that is unsubstituted or substituted with a fluorine atom, $R^{k3}$ represents a (q+1)-valent linking group, $R^{f3}$ represents a monovalent chain hydrocarbon group that is substituted with a fluorine atom, or a monovalent alicyclic hydrocarbon group that is substituted with a fluorine atom, and r is an integer from 1 to 3, wherein in a case where r is 2 or 3, each of a plurality of $R^{f3}$ is identical or different to each other.

17. The radiation-sensitive resin composition according to claim 2, wherein the polymer (A) further includes a repeating unit represented by a formula (f-5),

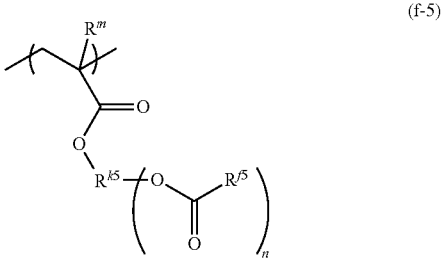

(f-5)

wherein $R^m$ represents a hydrogen atom, a fluorine atom, or a monovalent chain hydrocarbon group that is unsubstituted or substituted with a fluorine atom, $R^{f5}$ represents a monovalent chain hydrocarbon group that is substituted with a fluorine atom, or a monovalent alicyclic hydrocarbon group that is substituted with a fluorine atom, $R^{k5}$ represents an (n+1)-valent linking group, and n is an integer from 1 to 3, wherein in a case where n is 2 or 3, each of a plurality of $R^{f5}$ is identical or different to each other.

* * * * *